(12) United States Patent
Matsuda et al.

(10) Patent No.: US 8,815,490 B2
(45) Date of Patent: Aug. 26, 2014

(54) RADIATION-SENSITIVE RESIN COMPOSITION, POLYMER, AND METHOD FOR FORMING RESIST PATTERN

(75) Inventors: Yasuhiko Matsuda, Tokyo (JP); Tomohisa Fujisawa, Tokyo (JP); Yukari Hama, Tokyo (JP); Takanori Kawakami, Tokyo (JP)

(73) Assignee: JSR Corporation, Tokyo (JP)

(*) Notice: Subject to any disclaimer, the term of this patent is extended or adjusted under 35 U.S.C. 154(b) by 0 days.

(21) Appl. No.: 13/309,573

(22) Filed: Dec. 2, 2011

(65) Prior Publication Data

US 2012/0094234 A1 Apr. 19, 2012

Related U.S. Application Data

(63) Continuation of application No. PCT/JP2010/059388, filed on Jun. 2, 2010.

(30) Foreign Application Priority Data

Jun. 4, 2009 (JP) ................. 2009-135551

(51) Int. Cl.
| | | |
|---|---|---|
| G03F 7/004 | (2006.01) | |
| G03F 7/20 | (2006.01) | |
| C08F 12/20 | (2006.01) | |
| C08F 18/20 | (2006.01) | |
| C08F 14/18 | (2006.01) | |

(52) U.S. Cl.
USPC ........ 430/270.1; 430/394; 430/325; 430/326; 526/242; 526/245; 526/250; 526/253

(58) Field of Classification Search
USPC ................ 430/270.1, 325, 326; 526/242–263
See application file for complete search history.

(56) References Cited

U.S. PATENT DOCUMENTS

| | | | |
|---|---|---|---|
| 2008/0193872 A1 | 8/2008 | Caporale et al. | |
| 2008/0248425 A1 | 10/2008 | Nishiyama et al. | |
| 2008/0311507 A1 | 12/2008 | Isono et al. | |
| 2009/0061353 A1* | 3/2009 | Isono et al. | 430/270.1 |
| 2009/0197204 A1* | 8/2009 | Shiono et al. | 430/286.1 |
| 2010/0233626 A1 | 9/2010 | Shimizu et al. | |
| 2010/0310985 A1 | 12/2010 | Mori et al. | |
| 2011/0104611 A1* | 5/2011 | Sakakibara et al. | 430/270.1 |
| 2011/0151378 A1* | 6/2011 | Matsumura et al. | 430/270.1 |
| 2011/0177453 A1 | 7/2011 | Masubuchi et al. | |
| 2012/0064459 A1 | 3/2012 | Maeda et al. | |
| 2012/0077126 A1 | 3/2012 | Mori et al. | |

FOREIGN PATENT DOCUMENTS

| | | |
|---|---|---|
| EP | 1589375 | 10/2005 |
| EP | 2309332 | 4/2011 |
| EP | 2325694 | 5/2011 |
| JP | 2005-173474 | 6/2005 |
| JP | 2006-48029 | 2/2006 |
| JP | 2008-191644 | 8/2008 |
| JP | 2008-257166 | 10/2008 |
| JP | 2008-268915 | 11/2008 |
| JP | 2008-292580 | 12/2008 |
| JP | 2009-19199 | 1/2009 |
| JP | 2009-74085 | 4/2009 |
| JP | 2010-32994 | 2/2010 |
| JP | 2010-95643 | 4/2010 |
| JP | 2010-210953 | 9/2010 |
| JP | 2010-271668 | 12/2010 |
| JP | 2010-275498 | 12/2010 |
| JP | 2010-277043 | 12/2010 |
| WO | 2004/068242 | 8/2004 |
| WO | 2009/142181 | 11/2009 |
| WO | 2009/142183 | 11/2009 |
| WO | 2010/007993 | 1/2010 |
| WO | 2010/029982 | 3/2010 |

OTHER PUBLICATIONS

International Search Report for corresponding International Application No. PCT/JP2010/059388, Jun. 29, 2010.
Written Opinion for corresponding International Application No. PCT/ JP2010/059388, Jun. 29, 2010.
Extended European Search Report for corresponding EP Application No. 10783419.4-1226, Sep. 19, 2012.
European Office Action for corresponding EP Application No. 10 783 419.4-1555, May 28, 2013.
Japanese Office Action for corresponding JP Application No. 2011-518482, Mar. 4, 2014.

* cited by examiner

*Primary Examiner* — Amanda C. Walke
(74) *Attorney, Agent, or Firm* — Ditthavong & Steiner, P.C.

(57) ABSTRACT

The radiation-sensitive resin composition includes a first polymer, a second polymer and a radiation sensitive acid generator. The first polymer includes a repeating unit represented by formula (1). The second polymer includes an acid labile group and is dissociated by an action of acid so that alkali solubility is given by dissociation of said acid labile group. $R^1$ represents a hydrogen atom, a methyl group or a trifluoromethyl group. $R^2$ represents a single bond or a divalent linear, branched or cyclic, saturated or unsaturated hydrocarbon group having 1-20 carbon atoms. X represents a fluorine atom-substituted methylene group or a linear or branched fluoroalkylene group having 2-20 carbon atoms. $R^3$ represents a hydrogen atom or a monovalent organic group.

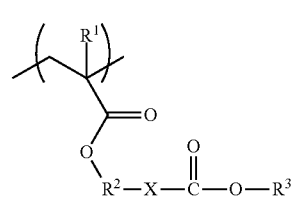

(1)

9 Claims, No Drawings

RADIATION-SENSITIVE RESIN COMPOSITION, POLYMER, AND METHOD FOR FORMING RESIST PATTERN

TECHNICAL FIELD

The present invention relates to a radiation sensitive resin composition, a polymer, and a method for forming a resist pattern. More specifically, the present invention relates to a radiation sensitive resin composition which is a material for a resist coating film that is capable of providing a good pattern shape, is not easily dissolved in an immersion exposure liquid such as water nor easily generates development defects, while having a large receding contact angle of the immersion exposure liquid, a polymer, and a method for forming a resist pattern.

BACKGROUND ART

In the field of micro-processing typified by the manufacture of an integrated circuit element, a lithography technique is required which makes it possible to realize more finely processing for a level to 0.10 μm or smaller. In the conventional lithography process, near ultraviolet rays such as i-rays are applied as radiation, however, it is said that micro-processing for a level to 0.10 μm or smaller, that is a level to subquarter micron is extremely difficult when the near ultraviolet rays are applied. Accordingly, the lithography using radiation having a shorter wave length than the near ultraviolet rays has been studied to enable micro-processing for a level to 0.10 μm or smaller. The short wave length radiation may be far ultraviolet rays including bright line spectrum by mercury lamp and excimer laser, X rays, electron beams, or the like. Among these, KrF excimer laser (wavelength 248 nm), and ArF excimer laser (wavelength 193 nm) are of particular interest.

Accompanying the interest of excimer laser, a number of resist film materials for excimer laser is proposed. An example is a composition (hereinafter, referred to as "chemically-amplified resist") utilizing the chemical amplification effect based on a component having an acid dissociable functional group and a component (hereinafter, referred to as "acid generator") which generates an acid upon being exposed to radiation (hereinafter, referred to as "exposure"). A composition has been proposed as the chemically-amplified resist, which comprises a resin having a t-butyl ester group of a carboxylic acid or t-butyl carbonate group of phenol and an acid generator. Regarding the composition, the t-butyl ester group or t-butyl carbonate group in the resin dissociates by an action of an acid generated upon exposure, whereby the resist has an acidic group such as a carboxyl group or a phenolic hydroxyl group. As a result, the exposed areas on the resist film become readily soluble in an alkaline developer and a desirable resist pattern can be obtained.

Formation of finer patterns (a fine resist pattern with a line width of about 45 nm, for example) will be required for such a micro-processing. Reducing the wavelength of a light source of an exposure apparatus and increasing the numerical aperture (NA) of a lens are thought to be a solution for forming a finer pattern. However, the reduction of the wavelength of a light source requires a new exposure apparatus and the apparatus is expensive. In addition, increasing the NA of a lens involves a problem of decreasing the depth of focus even if a resolution is increased due to a trade-off relationship between the resolution and the depth of focus.

Recently, a liquid immersion exposure process (i.e., liquid immersion lithography) has been reported as a lithography technique enabling a solution to such a problem. In the liquid immersion exposure process, a liquid refractive-index medium (liquid for the liquid immersion exposure process) such as pure water or a fluorine-containing inert liquid, which has a predetermined thickness, is interposed between a lens and a resist film formed on a substrate, that is, on the surface of the resist film. In this method, air or an inert gas such as nitrogen which has been conventionally used in an exposure optical path space is replaced with a liquid for immersion exposure having a larger refractive index (n) than air. Therefore, if the conventional light source is used, the same effect can be obtained as the case in which a shorter wavelength is used. That is to say, the resolution can be increased without decreasing the depth of focus.

Accordingly, since a resist pattern having a higher resolution and excellent depth of focus can be formed at a low cost using the lens mounted on the existing apparatuses by utilizing the liquid immersion exposure process. And a number of compositions for liquid immersion exposure are reported in, for example, Patent Documents 1 to 3.

PRIOR TECHNICAL LITERATURE

Patent Document

Patent Document 1: WO 04/068242 A
Patent Document 2: JP 2005-173474 A
Patent Document 3: JP 2006-48029 A

SUMMARY OF THE INVENTION

Problems to be Solved by the Invention

In the above-mentioned liquid immersion exposure process, however, an acid generator or the like is eluted from the resist film because the resist film is brought into direct contact with the liquid for the liquid immersion exposure process such as water during the exposure. When a large amount of the components is eluted, the lens may be damaged, a pattern having a pre-determined pattern shape may not be obtained, or a sufficient resolution may not be obtained.

Additionally, in a case in which water is used as the liquid for a liquid immersion exposure process, there are problems in that, if a receding contact angle at the resist film is low, water may not be sufficiently removed during a high speed scanning exposure to thereby give watermarks.

Moreover, if the compositions disclosed in Patent Documents 1 to 3 are used, the above-mentioned problems are not sufficiently solved and a problem exists particularly in that dissolution residues occur at the time of development. This defect is caused by the residues that are observed on a pattern after development. Specifically, this may be because, when deprotection (dissociating an acid labile group by an action of acid) is insufficient, solubility of a resin component like polymer is not fully exhibited in a developer and the resin component is aggregated in the developer to adhere on a pattern.

The present invention has been achieved in view of this situation. The object of the present invention is to provide a radiation sensitive resin composition which is a material for a resist coating film that is capable of providing a good pattern shape, is not easily dissolved in an immersion exposure liquid such as water nor easily generates development defects, while having a large receding contact angle of the immersion exposure liquid, a polymer capable of using as a resin component for the radiation sensitive resin composition, and a method for forming a resist pattern using the radiation sensitive resin composition.

Means for Solving the Problems

The present inventors conducted extensive studies in order to solve the above problems and found that when a contact angle of a developer at a resist film after post exposure bake (PEB) was lowered, occurrence of development defects could be suppressed to complete the invention.

The present invention provides the following.

[1] A radiation sensitive resin composition characterized by comprising:
a first polymer (A) which comprises a repeating unit (1) represented by the following general formula (1),
a second polymer (B) which comprises an acid labile group and is dissociated by an action of acid so that alkali solubility is given by dissociation of the acid labile group, and
a radiation sensitive acid generator (C).

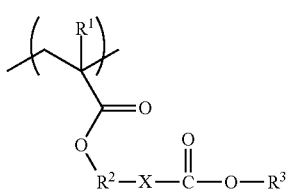

(1)

(In the formula, $R^1$ represents a hydrogen atom, a methyl group, or a trifluoromethyl group, $R^2$ represents a single bond, a divalent linear, branched, or cyclic, and saturated or unsaturated hydrocarbon group having 1 to 20 carbon atoms, X represents a methylene group substituted with a fluorine atom, or a linear or branched fluoroalkylene group having 2 to 20 carbon atoms, and $R^3$ represents a hydrogen atom or a monovalent organic group.)

[2] The radiation sensitive resin composition according to [2] above, wherein the polymer (A) further comprises a repeating unit (2) having an acid labile group (provided that a unit corresponding to the repeating unit (1) is excluded).

[3] The radiation sensitive resin composition according to [2] above, wherein the polymer (A) comprises, as the repeating unit (2), a repeating unit represented by the following general formula (2-1).

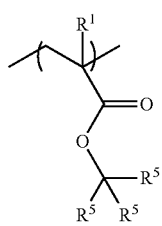

(2-1)

(In the formula, $R^4$ represents a hydrogen atom, a methyl group, a trifluoromethyl group, or a hydroxymethyl group, and $R^5$ each independently represents a linear or branched alkyl group having 1 to 4 carbon atoms, a monovalent alicyclic hydrocarbon group having 4 to 20 carbon atoms, or a group derived therefrom, or any two of $R^5$ bind to each other and form, together with the carbon atom to which they are attached, a divalent alicyclic hydrocarbon group having 4 to 20 carbon atoms, or a group derived therefrom, and the remaining one $R^5$ represents a linear or branched alkyl group having 1 to 4 carbon atoms, a monovalent alicyclic hydrocarbon group having 4 to 20 carbon atoms, or a group derived therefrom.)

[4] The radiation sensitive resin composition according to [2] above, wherein the polymer (A) comprises, as the repeating unit (2), a repeating unit represented by the following general formula (2-1-1).

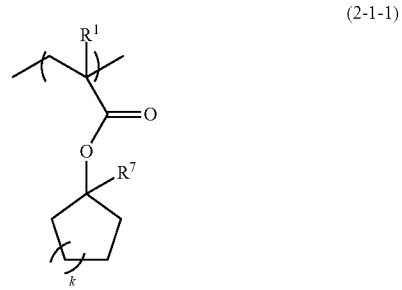

(2-1-1)

(In the formula, $R^6$ represents a hydrogen atom, a methyl group, a trifluoromethyl group, or a hydroxymethyl group, $R^7$ represents a linear or branched alkyl group having 1 to 4 carbon atoms, and k represents an integer of 1 to 4.)

[5] The radiation sensitive resin composition according to any one of [1] to [4] above, wherein the polymer (A) further comprises a repeating unit (3) having an alkali soluble group (provided that a unit corresponding to the repeating unit (1) is excluded), or a repeating unit (4) having an alkali reactive group (provided that a unit corresponding to the repeating unit (1) is excluded).

[6] The radiation sensitive resin composition according to [5] above, wherein the repeating unit (3) comprises, as the alkali soluble group, a functional group having a hydrogen atom having a pKa of 4 to 11.

[7] The radiation sensitive resin composition according to [5] or [6] above, wherein the repeating unit (3) comprises, as the alkali soluble group, at least one of functional groups represented by the following formulae (3a) to (3c).

(3a)

(3b)

(3c)

(In the formulae, $R^8$ represents a hydrocarbon group having 1 to 10 carbon atoms substituted with a fluorine atom, and Z represents a fluoromethylene group or an alkylene group having 2 to 20 carbon atoms substituted with a fluorine atom.)

[8] The radiation sensitive resin composition according to [5] above, wherein the repeating unit (4) comprises, as the alkali reactive group, a functional group having lactone skeleton or cyclic carbonate structure.

[9] The radiation sensitive resin composition according to [5] above, wherein the polymer (A) comprises, as the repeating unit (4), at least one of repeating units represented by the following general formulae (4a-1) to (4a-6) and a repeating unit represented by the following general formula (4b).

(4a-1)
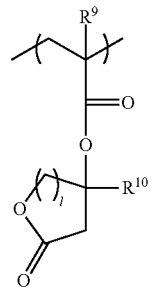

(4a-2)
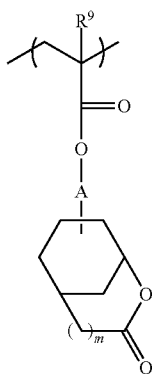

(4a-3)
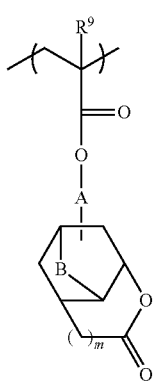

(4a-4)
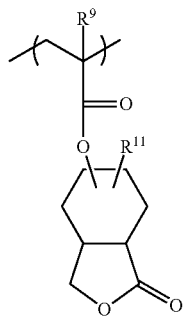

(4a-5)
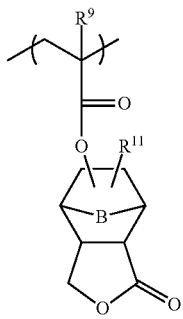

(4a-6)
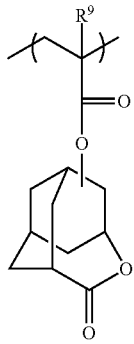

(In the formulae, $R^9$ represents a hydrogen atom or a methyl group, $R^{10}$ represents a hydrogen atom or an alkyl group having 1 to 4 carbon atoms which may have a substituent group, $R^{11}$ represents a hydrogen atom or a methoxy group, A represents a single bond, an ether group, an ester group, a carbonyl group, a divalent chained hydrocarbon group having 1 to 30 carbon atoms, a divalent alicyclic hydrocarbon group having 3 to 30 carbon atoms, a divalent aromatic hydrocarbon group having 6 to 30 carbon atoms, or a divalent group obtained by combination thereof, B represents an oxygen atom or a methylene group, l represents an integer of 1 to 3, and m represents 0 or 1.)

(4b)
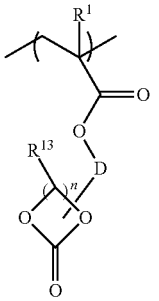

(In the formula, $R^{12}$ represents a hydrogen atom, a methyl group, or a trifluoromethyl group, $R^{13}$ represents a hydrogen atom or a chain hydrocarbon group having 1 to 5 carbon atoms, and when a plurality of $R^{13}$ is present, each may be the same or different from each other, D represents a single bond, a divalent or trivalent chained hydrocarbon group having 1 to 30 carbon atoms, a divalent or trivalent alicyclic hydrocarbon group having 3 to 30 carbon atoms, or a divalent or trivalent aromatic hydrocarbon group having 6 to 30 carbon atoms, and when D is trivalent, the carbon atom included in D and the carbon atom constituting the cyclic carbonate ester bind to each other to form a ring structure, and n represents an integer of 2 to 4.)

[10] The radiation sensitive resin composition according to any one of [1] to [9] above, wherein the content of the polymer (A) is in the range from 0.1 to 20 parts by mass based on 100 parts by mass of the polymer (B).

[11] A method for forming a resist pattern, comprising:

(1) forming a photoresist film on a substrate by using the radiation sensitive resin composition according to any one of [1] to [10] above, (2) subjecting the photoresist film to a liquid immersion exposure via a liquid for liquid immersion exposure after setting the liquid for liquid immersion exposure on the photoresist film, (3) developing the photoresist film obtained after the liquid immersion exposure process to form a resist pattern.

[12] A polymer characterized by comprising a repeating unit (1) represented by the following general formula (1) and a repeating unit (2) having an acid labile group (provided that a unit corresponding to the repeating unit (1) is excluded).

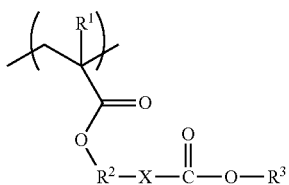

(In the formula, $R^1$ represents a hydrogen atom, a methyl group, or a trifluoromethyl group, $R^2$ represents a single bond, a divalent linear, branched, or cyclic, and saturated or unsaturated hydrocarbon group having 1 to 20 carbon atoms, X represents a methylene group substituted with a fluorine atom, or a linear or branched fluoroalkylene group having 2 to 20 carbon atoms, and $R^3$ represents a hydrogen atom or a monovalent organic group.)

Effects of the Invention

When the radiation sensitive resin composition of the present invention is used, a microfine photoresist film can be formed with high accuracy, which is excellent in depth of focus, is reduced in the amount of components dissolving in a liquid for immersion exposure such as water, has a large receding contact angle of the liquid for immersion exposure, and hardly generates development defects. Further, as having high water repellency and a large receding contact angle, it can be suitably used for a process of a liquid immersion exposure process for forming a resist pattern without forming a protective film on surface of a resist film. Therefore, it is believed that the radiation sensitive resin composition of the invention is suitable for fine lithography that will be required in the future.

DESCRIPTION OF EXEMPLARY EMBODIMENTS

Hereinafter, embodiments of the present invention is specifically described, however, the present invention is not limited by the embodiments given below. It should be understood that, without departing from the spirit of the invention, suitable design changes and modifications, etc. may be made according to common knowledge of a person skilled in the art.

In the specification, "(meth)acryl" means either or both of "acryl" and "methacryl".

[1] Radiation Sensitive Resin Composition

The radiation sensitive resin composition of the present invention contains a first polymer (A) (hereinafter, simply referred to as "polymer (A)") which has a repeating unit (1) represented by the following general formula (1) (hereinafter, referred to as "repeating unit (1)"), a second polymer (B) (hereinafter, simply referred to as "polymer (B)") which has an acid labile group and is dissociated by an action of acid so that alkali solubility is given by dissociation of the acid labile group, and a radiation sensitive acid generator (C) (hereinafter, simply referred to as "acid generator (C)").

The radiation sensitive resin composition is a material for resist film which enables obtainment of good pattern shape, has excellent depth of focus, does not easily elute in a liquid for liquid immersion exposure such as water, has a large receding contact angle of the liquid for liquid immersion exposure, and hardly causes development defects.

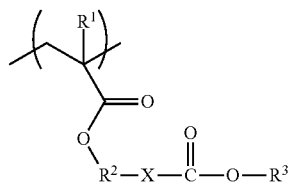

(In the formula, $R^1$ represents a hydrogen atom, a methyl group, or a trifluoromethyl group, $R^2$ represents a single bond, a divalent linear, branched, or cyclic, and saturated or unsaturated hydrocarbon group having 1 to 20 carbon atoms, X represents a methylene group substituted with a fluorine atom, or a linear or branched fluoroalkylene group having 2 to 20 carbon atoms, and $R^3$ represents a hydrogen atom or a monovalent organic group.)

(1-1) Polymer (A)

The polymer (A) is a polymer containing the repeating unit (1).

The polymer (A) contains a fluorine moiety in its structure. Therefore, when the polymer is added to a resist composition as a component constituting the resist composition and a resist film is formed using the resist composition, there is a tendency that concentration of the polymer (A) is high on a surface of the resist film due to high oil-repellent characteristics of the polymer in a film. For such reasons, elution of an acid generator or acid diffusion controlling agent in a resist film into a liquid for liquid immersion exposure such as water, which occurs during liquid immersion exposure, can be suppressed. Moreover, due to the oil-repellent characteristics of the polymer (A), a receding contact angle of a liquid for liquid immersion exposure at the resist film is increased. As a result, water drops originating from a liquid for liquid immersion exposure hardly remain on a resist film, and an occurrence of defects caused by a liquid for liquid immersion exposure, i.e. watermark, etc., can be suppressed even at the time of performing scanning exposure at high speed.

Examples of the divalent, linear or branched, and saturated or unsaturated hydrocarbon group having 1 to 10 carbon atoms as $R^2$ in the general formula (1) include a divalent hydrocarbon group derived from a linear or branched alkyl group having 1 to 10 carbon atoms such as a methyl group, an ethyl group. a n-propyl group, an i-propyl group, a n-butyl group, a 2-methylpropyl group, a 1-methylpropyl group. a t-butyl group, a pentyl group, an isopentyl group, a neopentyl group, a hexyl group, a heptyl group, an octyl group, a nonyl group, and a decyl group; and the like.

Additionally, examples of the divalent, cyclic, and saturated or unsaturated hydrocarbon group as $R^2$ in the general formula (1) include a group derived from an alicyclic hydrocarbon having 3 to 20 carbon atoms and an aromatic hydrocarbon.

Examples of the alicyclic hydrocarbon include a cycloalkane such as a cyclobutane, a cyclopentane, a bicyclo[2.2.1]heptane, a bicyclo[2.2.2]octane, a tricyclo[5.2.1.0$^{2,6}$]decane, a tricyclo[3.3.1.1$^{3,7}$]decane, and a tetracyclo[6.2.1.1$^{3,6}$.0$^{2,7}$]dodecane; and the like.

Examples of the aromatic hydrocarbon include benzene, naphthalene, and the like.

The hydrocarbon group represented by $R^2$ may be a group obtained by substituting at least one hydrogen atom of the unsubstituted hydrocarbon group with at least one of a linear, branched, or cyclic alkyl group having 1 to 4 carbon atoms, such as a methyl group, an ethyl group, a n-propyl group, an i-propyl group, a n-butyl group, a 2-methylpropyl group, a 1-methylpropyl group, or a t-butyl group, a hydroxyl group, a cyano group, a hydroxyalkyl group having 1 to 10 carbon atoms, a carboxyl group, an oxygen atom, and the like.

Additionally, specific examples of $R^2$ in the general formula (1) include the following groups represented by the structure (a1) to (a27). The symbol "*" in the structure (a1) to (a27) indicates a bonding site.

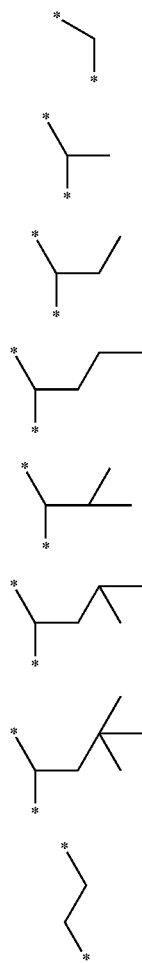

(a1)

(a2)

(a3)

(a4)

(a5)

(a6)

(a7)

(a8)

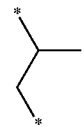

(a9)

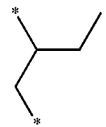

(a10)

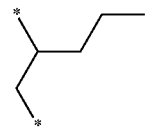

(a11)

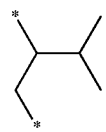

(a12)

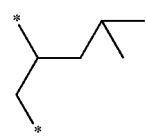

(a13)

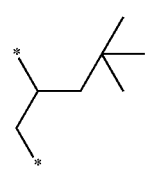

(a14)

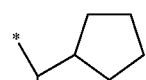

(a15)

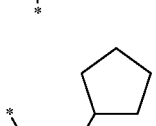

(a16)

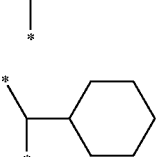

(a17)

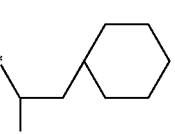

(a18)

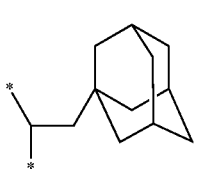

(a19)

(a20) 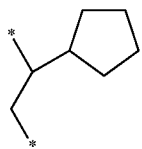

(a21) 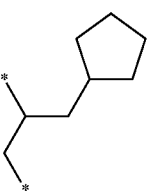

(a22) 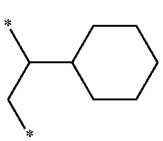

(a23) 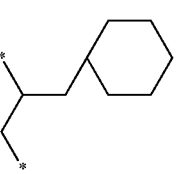

(a24) 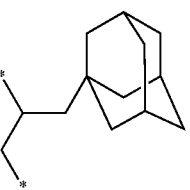

(a25) 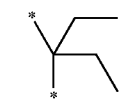

(a26) 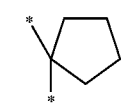

(a27) 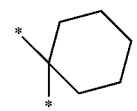

In particular, $R^2$ in the general formula (1) is preferably a methylene group, an ethylene group, a 1-methylethylene group, a 2-methylethylene group, and a divalent alicyclic hydrocarbon group having 4 to 20 carbon atoms, or a group derived therefrom.

Examples of the monovalent organic group as $R^3$ in the general formula (1) include an acid labile group and a monovalent hydrocarbon group having 1 to 20 carbon atoms (except groups corresponding to an acid labile group).

The acid labile group refers to a group that substitutes a hydrogen atom of a carboxyl group and dissociates in the presence of an acid.

Examples of the acid labile group include a t-butoxycarbonyl group, a tetrahydropyranyl group, a tetrahydrofuranyl group, a (thiotetrahydropyranylsulfanyl)methyl group, a (thiotetrahydrofuranylsulfanyl)methyl group, an alkoxy-substituted methyl group, an alkylsulfanyl-substituted methyl group, and the like.

Examples of the alkoxyl group (substituent) for the alkoxy-substituted methyl group include an alkoxyl group having 1 to 4 carbon atoms. Examples of the alkyl group (substituent) for the alkylsulfanyl-substituted methyl group include an alkyl group having 1 to 4 carbon atoms.

Further, examples of the acid labile group include a group shown by the general formula "—$C(R)_3$" (wherein R individually represent a linear or branched alkyl group having 1 to 4 carbon atoms, a monovalent alicyclic hydrocarbon group having 4 to 20 carbon atoms, or a group derived therefrom, or two of R bond to form a divalent alicyclic hydrocarbon group having 4 to 20 carbon atoms, or a group derived therefrom, together with a carbon atom bonded thereto, and the remaining R represents a linear or branched alkyl group having 1 to 4 carbon atoms, a monovalent alicyclic hydrocarbon group having 4 to 20 carbon atoms, or a group derived therefrom).

Examples of the linear or branched alkyl group having 1 to 4 carbon atoms represented by R in the acid labile group shown by the general formula "—$C(R)_3$" include a methyl group, an ethyl group, a n-propyl group, an i-propyl group, a n-butyl group, a 2-methylpropyl group, a 1-methylpropyl group, a t-butyl group, and the like.

Examples of the monovalent alicyclic hydrocarbon group having 4 to 20 carbon atoms represented by R include a group that includes an alicyclic ring derived from a cycloalkane (e.g., norbornane, tricyclodecane, tetracyclododecane, adamantane, cyclobutane, cyclopentane, cyclohexane, cycloheptane, or cyclooctane), and the like.

Examples of a group derived from the alicyclic hydrocarbon group include a group obtained by substituting the monovalent alicyclic hydrocarbon group with at least one linear, branched, or cyclic alkyl group having 1 to 4 carbon atoms, such as a methyl group, an ethyl group, a n-propyl group, an i-propyl group, a n-butyl group, a 2-methylpropyl group, a 1-methylpropyl group, or a t-butyl group, and the like.

Among these, an alicyclic hydrocarbon group that includes an alicyclic ring derived from norbornane, tricyclodecane, tetracyclododecane, adamantane, cyclopentane, or cyclohexane, a group obtained by substituting the alicyclic hydrocarbon group with the above alkyl group, and the like are preferable.

Examples of the divalent alicyclic hydrocarbon group having 4 to 20 carbon atoms that is formed by two of R together with the carbon atom that is bonded thereto (i.e., the carbon atom bonded to the oxygen atom) include a monocyclic hydrocarbon ring group such as a cyclobutylene group, a cyclopentylene group, a cyclohexylene group and a cyclooctylene group; a polycyclic hydrocarbon group such as a norbornylene group, a tricyclodecanylene group, and a tetracyclodecanylene group; a polycyclic crosslinked hydrocarbon group such as adamantylene group; and the like.

Examples of a group derived from the divalent alicyclic hydrocarbon group formed by two of R include a group obtained by substituting the divalent alicyclic hydrocarbon group with at least one linear, branched, or cyclic alkyl group having 1 to 4 carbon atoms, such as a methyl group, an ethyl group, a n-propyl group, an i-propyl group, a n-butyl group, a 2-methylpropyl group, a 1-methylpropyl group, or a t-butyl group, and the like.

Among these, monocyclic hydrocarbon ring group such as a cyclopentylene group and a cyclohexylene group, a group obtained by substituting the divalent alicyclic hydrocarbon group (monocyclic hydrocarbon group) with any of the above alkyl groups, and the like are preferable.

Examples of a preferable acid labile group shown by the general formula "—C(R)$_3$" include a t-butyl group, a 1-n-(1-ethyl-1-methyl)propyl group, a 1-n-(1,1-dimethyl)propyl group, a 1-n-(1,1-dimethyl)butyl group, a 1-n-(1,1-dimethyl) pentyl group, 1-(1,1-diethyl)propyl group, a 1-n-(1,1-diethyl) butyl group, a 1-n-(1,1-diethyl)pentyl group, a 1-(1-methyl) cyclopentyl group, a 1-(1-ethyl)cyclopentyl group, a 1-(1-n-propyl)cyclopentyl group, a 1-(1-i-propyl)cyclopentyl group, a 1-(1-methyl)cyclohexyl group, a 1-(1-ethyl)cyclohexyl group, a 1-(1-n-propyl)cyclohexyl group, a 1-(1-i-propyl)cyclohexyl group, a 1-{1-methyl-1-(2-norbornyl)}ethyl group, a 1-{1-methyl-1-(2-tetracyclodecanyl)}ethyl group, a 1-{1-methyl-1-(1-adamantyl)}ethyl group, a 2-(2-methyl)norbornyl group, a 2-(2-ethyl)norbornyl group, a 2-(2-n-propyl) norbornyl group, a 2-(2-i-propyl)norbornyl group, a 2-(2-methyl)tetracyclodecanyl group, a 2-(2-ethyl) tetracyclodecanyl group, a 2-(2-n-propyl)tetracyclodecanyl group, a 2-(2-i-propyl)tetracyclodecanyl group, a 1-(1-methyl)adamantyl group, a 1-(1-ethyl)adamantyl group, a 1-(1-n-propyl)adamantyl group, a 1-(1-i-propyl)adamantyl group, groups obtained by substituting these groups with at least one linear, branched, or cyclic alkyl group having 1 to 4 carbon atoms, such as a methyl group, an ethyl group, a n-propyl group, an i-propyl group, a n-butyl group, a 2-methylpropyl group, a 1-methylpropyl group, or a t-butyl group, and the like.

Among these, the group shown by the general formula "—C(R)$_3$", a t-butoxycarbonyl group, an alkoxy-substituted methyl group, and the like are preferable. In particular, an alkoxy-substituted methyl group and the group shown by the general formula "—C(R)$_3$" is preferable.

Examples of the methylene group substituted with a fluorine atom or the linear or branched fluoroalkylene group having 2 to 20 carbon atoms represented by X in the general formula (1) include structures shown by the following formulas (X-1) to (X-8), and the like.

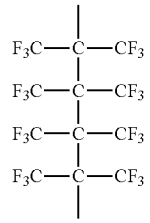
(X-1)

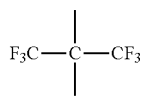
(X-2)

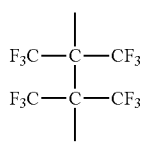
(X-3)

(X-4)

(X-5)

(X-6)

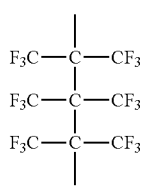
(X-7)

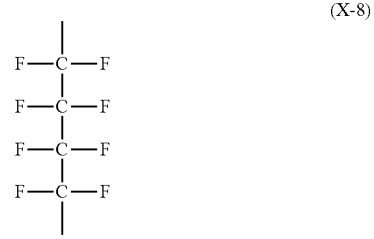
(X-8)

Particularly, the repeating unit (1) is preferably the following repeating units deriving from compounds represented by formulae (1-4) to (1-6).

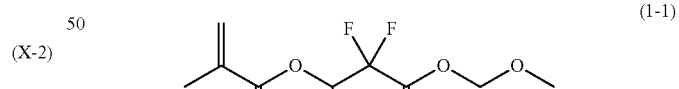
(1-1)

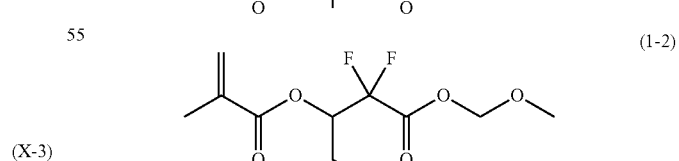
(1-2)

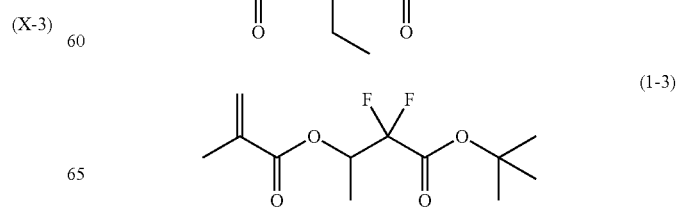
(1-3)

(1-4)

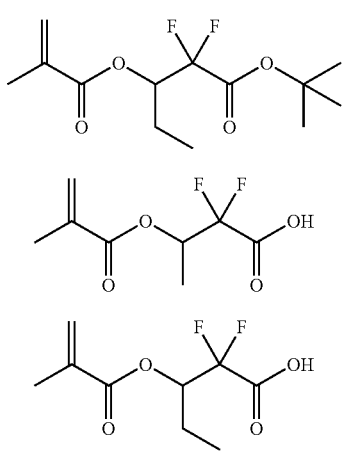

(1-5)

(1-6)

The polymer (A) may have only one kind of the repeating unit (1) or two or more kinds thereof.

The polymer (A) may further contain, in addition to the repeating unit (1), a repeating unit (2) having an acid labile group (provided that a unit corresponding to the repeating unit (1) is excluded) (hereinafter, referred to simply as "repeating unit (2)").

When the polymer (A) contains the repeating unit (2), a difference between advancing contact angle and receding contact angle at a resist coating film can be lowered, and therefore coping with increased scan speed at the time of exposure can be achieved.

The preferable repeating unit (2) is the following repeating unit represented by the general formula (2-1), for example.

(2-1)

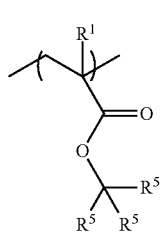

(In the formula, $R^4$ represents a hydrogen atom, a methyl group, or a trifluoromethyl group, $R^5$ each independently represents a linear or branched alkyl group having 1 to 4 carbon atoms, a monovalent alicyclic hydrocarbon group having 4 to 20 carbon atoms, or a group derived therefrom, or any two of $R^5$ bind to each other and form, together with the carbon atom to which they are attached, a divalent alicyclic hydrocarbon group having 4 to 20 carbon atoms, or a group derived therefrom, and the remaining one $R^5$ represents a linear or branched alkyl group having 1 to 4 carbon atoms, a monovalent alicyclic hydrocarbon group having 4 to 20 carbon atoms, or a group derived therefrom.)

The description given above in connection with the acid labile group represented by the general formula [—$C(R)_3$] may be applied to [—$C(R^5)_3$] in the general formula (2-1).

The repeating unit (2) is particularly preferably a repeating unit represented by the following general formula (2-1-1) as the repeating unit represented by the general formula (2-1).

(2-1-1)

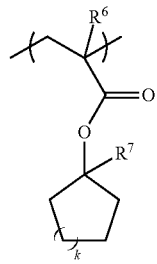

(In the formula, $R^6$ represents a hydrogen atom, a methyl group, a trifluoromethyl group, or a hydroxymethyl group, $R^7$ represents a linear or branched alkyl group having 1 to 4 carbon atoms, and k represents in integer of 1 to 4.)

Examples of the linear or branched alkyl group having 1 to 4 carbon atoms as $R^7$ in the general formula (2-1-1) include a methyl group, an ethyl group. a n-propyl group, an i-propyl group, a n-butyl group, a 2-methylpropyl group, a 1-methylpropyl group, a t-butyl group, and the like.

Specific examples of a monomer for forming the repeating unit represented by the general formula (2-1) include (meth) acrylic acid 2-methyladamantan-2-yl ester, (meth)acrylic acid 2-methyl-3-hydroxyadamantan-2-yl ester, (meth)acrylic acid 2-ethyladamantan-2-yl ester, (meth)acrylic acid 2-ethyl-3-hydroxyadamantan-2-yl ester, (meth)acrylic acid 2-n-propyladamantan-2-yl ester, (meth)acrylic acid 2-isopropyladamantan-2-yl ester, (meth)acrylic acid-2-methylbicyclo [2.2.1]hept-2-yl ester, (meth)acrylic acid-2-ethylbicyclo [2.2.1]hept-2-yl ester, (meth)acrylic acid-8-methyltricyclo [5.2.1.0$^{2,6}$]decan-8-yl ester, (meth)acrylic acid-8-ethyltricyclo[5.2.1.0$^{2,6}$]decan-8-yl ester, (meth)acrylic acid-4-methyltetracyclo[6.2.1$^{3,6}$.0$^{2,7}$]dodecan-4-yl ester, (meth) acrylic acid-4-ethyltetracyclo[6.2.1$^{3,6}$.0$^{2,7}$]dodecan-4-yl ester, (meth)acrylic acid 2-(bicyclo[2.2.1]hept-2-yl)-2-methylethyl ester, (meth)acrylic acid 2-(tricyclo[5.2.1.0$^{2,6}$]decan-8-yl)-2-methylethyl ester, (meth)acrylic acid 2-(tetracyclo [6.2.1$^{3,6}$.0$^{2,7}$]dodecan-4-yl)-2-methylethyl ester, (meth) acrylic acid 2-(adamantan-2-yl)-2-methylethyl ester, (meth) acrylic acid 2-(3-hydroxyadamantan-2-yl)-2-methylethyl ester, (meth)acrylic acid 1,2-dicyclohexylethyl ester, (meth) acrylic acid 1,2-di(bicyclo[2.2.1]hept-2-yl)ethyl ester, (meth)acrylic acid 1,2-di(tricyclo[5.2.1.0$^{2,6}$]decan-8-yl) ethyl ester, (meth)acrylic acid 1,2-di(tetracyclo[6.2.1$^{3,6}$.0$^{2,7}$] dodecan-4-yl)ethyl ester, (meth)acrylic acid 1,2-di(adamantan-2-yl)ethyl ester, (meth)acrylic acid 2-methyl-2-cyclopentyl ester, (meth)acrylic acid 2-ethyl-2-cyclopentyl ester, (meth)acrylic acid 2-isopropyl-2-cyclopentyl ester, (meth)acrylic acid 2-methyl-2-cyclohexyl ester, (meth) acrylic acid 2-ethyl-2-cyclohexyl ester, (meth)acrylic acid 2-ethyl-2-cyclooctyl ester, and the like.

Among these monomers, (meth)acrylic acid 2-methyl-2-cyclopentyl ester, (meth)acrylic acid 2-ethyl-2-cyclopentyl ester, (meth)acrylic acid 2-isopropyl-2-cyclopentyl ester, (meth)acrylic acid 2-methyl-2-cyclohexyl ester, (meth) acrylic acid 2-ethyl-2-cyclohexyl ester, and (meth)acrylic acid 2-ethyl-2-cyclooctyl ester are preferable leading to the repeating unit represented by the general formula (2-1-1).

In addition, the polymer (A) may have only one kind of the repeating unit (2) or two or more kinds thereof.

The polymer (A) is preferably further contain, in addition to the repeating units (1) and (2), a repeating unit (3) having an alkali soluble group (provided that a unit corresponding to the repeating unit (I) is excluded) (hereinafter, referred to simply as "repeating unit (3)"], or a repeating unit (4) having an alkali reactive group (provided that a unit corresponding to the repeating unit (1) is excluded) (hereinafter, referred to simply as "repeating unit (4)").

This case is preferable from the viewpoint of improving solubility in a developer.

The alkali soluble group in the repeating unit (3) is a repeating unit having a hydrogen atom having a pKa of 4 to 11. This ease is preferable from the viewpoint of improving solubility in a developer.

Examples of the alkali soluble group include, for example, the following functional groups represented by formulae (3a) to (3e), and the like.

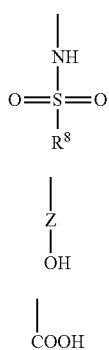

(3a)

(3b)

(3c)

(In the formulae, $R^8$ represents a hydrocarbon group having 1 to 10 carbon atoms substituted with a fluorine atom, and Z represents a fluoromethylene group or an alkylene group having 2 to 20 carbon atoms substituted with a fluorine atom.)

The hydrocarbon group having 1 to 10 carbon atoms substituted with a fluorine atom as $R^8$ in the general formula (3a) is not particularly limited so long as at least one hydrogen atoms in a hydrocarbon group having 1 to 10 carbon atoms are substituted with a fluorine atom, and the preferable is a trifluoromethyl group, and the like.

Additionally, the alkylene group having 2 to 20 carbon atoms substituted with a fluorine atom as Z in the general formula (3b) is not particularly limited so long as at least one hydrogen atoms in an alkylene group having 2 to 20 carbon atoms are substituted with a fluorine atom, and preferable example includes, for example, the above-described structures represented by (X-1) to (X-8), and the like. Of these, the structure represented by (X-1) is particularly preferable.

The main skeleton of the repeating unit (3) is not particularly limited and is preferably a structure deriving from a methacrylic acid ester, an acrylic acid ester, an α-trifluoroacrylic acid ester, or the like.

Further, examples of the repeating unit (3) include repeating units deriving from the following compounds represented by general formulae (3-1) to (3-3).

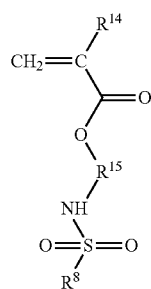

(3-1)

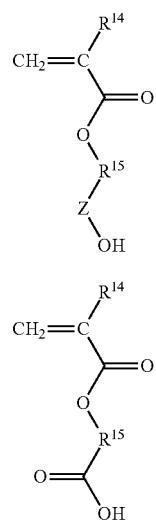

(3-2)

(3-3)

(In the formula, $R^{14}$ represents a hydrogen atom, a methyl group, or a trifluoromethyl group, $R^{15}$ represents a single bond, or a divalent, linear, branched, or cyclic, and saturated or unsaturated hydrocarbon group having 1 to 20 carbon atoms, $R^8$ represents a hydrocarbon group having 1 to 20 carbon atoms, substituted with a fluorine atom, and Z represents a fluoromethylene group, or an alkylene group having 2 to 20 carbon atoms, substituted with a fluorine atom.)

The description given above in connection with $R^2$ in the general formula (1) may be applied to the group represented by $R^{15}$ in the general formulae (3-1) to (3-3).

Additionally, the description given above in connection with $R^8$ in the general formula (3a) and Z in the general formula (3-2) may be applied to the groups represented by $R^{15}$ in the general formula (3a) and Z in the general formula (3b), respectively.

The polymer (A) may have only one kind of the repeating unit (3) or two or more kinds thereof.

The alkali reactive group in the repeating unit (4) is preferably a functional group having a lactone skelton or a cyclic carbonate structure.

The main skeleton of the repeating unit (4) is not particularly limited and is preferably a structure deriving from a methacrylic acid ester, an acrylic acid ester, an α-trifluoroacrylic acid ester, or the like.

Examples of the repeating unit (4) in which a functional group having a lactone skelton is contained as the alkali reactive group include the following repeating units represented by the general formulae (4a-1) to (4a-6).

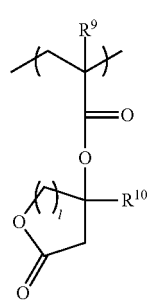

(4a-1)

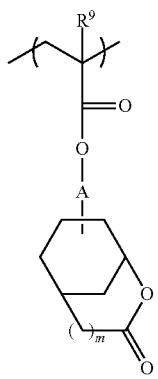

(4a-2)

(4a-3)

(4a-4)

(4a-5)

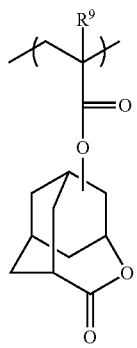

(4a-6)

(In the formula, $R^9$ represents a hydrogen atom or a methyl group, $R^{10}$ represents a hydrogen atom or an alkyl group having 1 to 3 carbon atoms which may have a substituent, $R^{11}$ represents a hydrogen atom or a methoxy group, A represents a single bond, an ether group, an ester group, a carbonyl group, a divalent chained hydrocarbon group having 1 to 30 carbon atoms, a divalent alicyclic hydrocarbon group having 3 to 30 carbon atoms, a divalent aromatic hydrocarbon group having 6 to 30 carbon atoms, or a divalent group obtained by combination thereof, B represents an oxygen atom or a methylene group, l represents an integer of 1 to 3, and m represents 0 or 1.)

Examples of the alkyl group having 1 to 4 carbon atoms, which may have a substituent as $R^{10}$ in the general formula (4a-1) include a methyl group, an ethyl group. a n-propyl group, an i-propyl group, a n-butyl group, a 2-methylpropyl group, a 1-methylpropyl group. a t-butyl group, and the like.

Additionally, at least one hydrogen atoms in the alkyl group may be substituted. Specific examples of the substituent include a halogen atom such as fluorine atom, chlorine atom and bromine atom, a phenyl group, an acetoxy group, an alkoxy group, and the like.

Examples of the divalent chained hydrocarbon group having 1 to 30 carbon atoms as A in the general formulae (4a-2) and (4a-3) include a linear alkylene group such as a methylene group, an ethylene group, a 1,2-propylene group, a 1,3-propylene group, a tetramethylene group, a pentamethylene group, a hexamethylene group, a heptamethylene group, an octamethylene group, a nonamethylene group, a decamethylene group, an undecamethylene group, a dodecamethylene group, a tridecamethylene group, a tetradecamethylene group, a pentadecamethylene group, a hexadecamethylene group, a heptadecamethylene group, an octadecamethylene group, a nonadecamethylene group, and an icosylene group; and a branched alkylene group such as a 1-methyl-1,3-propylene group, a 2-methyl-1,3-propylene group, a 2-methyl-1,2-propylene group, a 1-methyl-1,4-butylene group, a 2-methyl-1,4-butylene group, a methylidene group, an ethylidene group, a propylidene group, and a 2-propylidene group; and the like.

Examples of the divalent alicyclic hydrocarbon group having 3 to 30 carbon atoms as A in the general formulae (4a-2) and (4a-3) include a monocyclic cycloalkylene group such as a 1,3-cyclobutylene group, a 1,3-cyclopentylene group, a 1,4-cyclohexylene group, and a 1,5-cyclooctylene group; a polycyclic cycloalkylene group such as a 1,4-norbornylene group, a 2,5-norbornylene group, a 1,5-adamantylene group, and 2,6-adamantylene group; and the like.

Examples of the divalent aromatic hydrocarbon group having 6 to 30 carbon atoms as A in the general formulae (4a-2)

and (4a-3) include an arylene group such as a phenylene group, a tolylene group, a naphthylene group, a phenanthrylene group, and an anthrylene group; and the like.

Specific examples of the preferred monomer for providing the repeating unit (4) having a lactone skeleton include (meth)acrylic acid-5-oxo-4-oxa-tricyclo[4.2.1.0$^{3,7}$]nona-2-yl ester, (meth)acrylic acid-9-methoxycarbonyl-5-oxo-4-oxa-tricyclo[4.2.1.0$^{3,7}$]nona-2-yl ester, (meth)acrylic acid-5-oxo-4-oxa-tricyclo[5.2.1.0$^{3,8}$]deca-2-yl ester, (meth)acrylic acid-10-methoxycarbonyl-5-oxo-4-oxa-tricyclo[5.2.1.0$^{3,8}$]nona-2-yl ester, (meth)acrylic acid-6-oxo-7-oxa-bicyclo[3.2.1]octa-2-yl ester, (meth)acrylic acid-4-methoxycarbonyl-6-oxo-7-oxa-bicyclo[3.2.1]octa-2-yl ester, (meth)acrylic acid-7-oxo-8-oxa-bicyclo[3.3.1]octa-2-yl ester, (meth)acrylic acid-4-methoxycarbonyl-7-oxo-8-oxa-bicyclo[3.3.1]octa-2-yl ester, (meth)acrylic acid-2-oxotetrahydropyran-4-yl ester, (meth)acrylic acid-4-methyl-2-oxotetrahydropyran-4-yl ester, (meth)acrylic acid-4-ethyl-2-oxotetrahydropyran-4-yl ester, (meth)acrylic acid-4-propyl-2-oxotetrahydropyran-4-yl ester, (meth)acrylic acid-5-oxotetrahydrofuran-3-yl ester, (meth)acrylic acid-2,2-dimethyl-5-oxotetrahydrofuran-3-yl ester, (meth)acrylic acid-4,4-dimethyl-5-oxotetrahydrofuran-3-yl ester, (meth)acrylic acid-2-oxotetrahydrofuran-3-yl ester, (meth)acrylic acid-4,4-dimethyl-2-oxotetrahydrofuran-3-yl ester, (meth)acrylic acid-5,5-dimethyl-2-oxotetrahydrofuran-3-yl ester, (meth)acrylic acid-2-oxotetrahydrofuran-3-yl ester, (meth)acrylic acid-5-oxotetrahydrofuran-2-yl methyl ester, (meth)acrylic acid-3,3-dimethyl-5-oxotetrahydrofuran-2-yl methyl ester, and (meth)acrylic acid-4,4-dimethyl-5-oxotetrahydrofuran-2-yl methyl ester, and the like.

In addition, examples of the repeating unit (4) containing the functional group having a cyclic carbonate structure as the alkali reactive group include the following repeating unit represented by the general formula (4b).

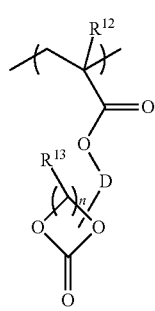

(4b)

(In the formula, R$^{12}$ represents a hydrogen atom, a methyl group, or a trifluoromethyl group, R$^{13}$ represents a hydrogen atom, or a chained hydrocarbon group having 1 to 5 carbon atoms, and when a plurality of R$^{13}$ is present, each may be the same or different from each other, D represents a single bond, a divalent or trivalent chained hydrocarbon group having 1 to 30 carbon atoms, a divalent or trivalent alicyclic hydrocarbon group having 3 to 30 carbon atoms, or a divalent or trivalent aromatic hydrocarbon group having 6 to 30 carbon atoms, and when D is trivalent, the carbon atom included in D and the carbon atom constituting the cyclic carbonate ester bind to each other to form a ring structure, and n represents an integer of 2 to 4.)

In the general formula (4b), n represents an integer of 2 to 4. Specifically, the cyclic carbonate structure has a 5-membered ring structure when n is 2 (ethylene group), a 6-membered ring structure when n is 3 (propylene group), and a 7-membered ring structure when n is 4 (butylene group).

In the general formula (4b), D represents a single bond, a divalent or trivalent, substituted or unsubstituted chained hydrocarbon group having 1 to 30 carbon atoms, a divalent or trivalent, substituted or unsubstituted alicyclic hydrocarbon group having 3 to 30 carbon atoms which may have a heteroatom, or a divalent or trivalent, substituted or unsubstituted aromatic hydrocarbon group having 6 to 30 carbon atoms.

When D is a single bond, an oxygen atom of the (meth)acrylic acid which constitutes the polymer and a carbon atom forming the cyclic carbonate structure are directly bonded to each other.

The chained hydrocarbon group means a hydrocarbon group which consists of only a chain structure without having any cyclic structure in main chain.

Examples of the divalent chained hydrocarbon group having 1 to 30 carbon atoms include a linear alkylene group such as a methylene group, an ethylene group, a 1,2-propylene group, a 1,3-propylene group, a tetramethylene group, a pentamethylene group, a hexamethylene group, a heptamethylene group, an octamethylene group, a nonamethylene group, a decamethylene group, an undecamethylene group, a dodecamethylene group, a tridecamethylene group, a tetradecamethylene group, a pentadecamethylene group, a hexadecamethylene group, a heptadecamethylene group, an octadecamethylene group, a nonadecamethylene group, and an icosylene group; and a branched alkylene group such as a 1-methyl-1,3-propylene group, a 2-methyl-1,3-propylene group, a 2-methyl-1,2-propylene group, a 1-methyl-1,4-butylene group, a 2-methyl-1,4-butylene group, a methylidene group, an ethylidene group, a propylidene group, and a 2-propylidene group; and the like.

Examples of the trivalent chained hydrocarbon group having 1 to 30 carbon atoms include a group from which one hydrogen atom in the functional group is eliminated.

A specific structure for a case in which D is a chained hydrocarbon group is a structure in which an oxygen atom of the (meth)acrylic acid constituting the polymer and a carbon atom forming the cyclic carbonate structure are bonded to each other via a linear alkyl group having 1 to 5 carbon atoms (see, the repeating unit (4b-1) to (4b-6) shown below). Further, the chained hydrocarbon group may have a substituent group (see, the repeating unit (4b-16) shown below).

It is also possible that the carbon atom included in D and the carbon which constituting the cyclic carbonate structure bind to each other to form a ring structure. In other words, the cyclic carbonate structure may form a part of a bridged ring, a fused ring, or a spiro ring. When two carbon atoms from the cyclic carbonate structure are included in a ring structure, a bridged ring or a fused ring is formed. When only one carbon atom from the cyclic carbonic acid ester is included in a ring structure, a spiro ring is formed. The repeating units (4b-7), (4b-9), (4b-11), (4b-12), (4b-15), and (4b-17) to (4b-22) described below are examples of a fused ring (5- to 6-membered ring) wherein a carbon atom included in D and two carbon atoms forming the cyclic carbonate structure are included. Meanwhile, the repeating unit (4b-10) and (4b-14) described below are examples of a spiro ring wherein a carbon atom included in D and one carbon atom forming the cyclic carbonate structure are included. The ring structure may be also a heterocycle which contains a heteroatom such as an oxygen (O) atom and a nitrogen (N) atom (see, the repeating unit (4b-17) to (4b-22) described below). Meanwhile, the repeating unit (4b-8) and (4b-13) described below are examples of a bridged ring in which two carbon atoms included in D and two carbon atoms forming the cyclic carbonate structure are included.

The term "alicyclic hydrocarbon group" means a hydrocarbon group which contains, in the ring structure, only an alicyclic hydrocarbon structure but no aromatic structure, with the proviso that, it is not necessarily required for the alicyclic hydrocarbon group to be constituted only with an alicyclic hydrocarbon structure, and it may have a chained structure in the part thereof.

Examples of the divalent alicyclic hydrocarbon group include a monocyclic cycloalkylene group such as a 1,3-cyclobutylene group, a 1,3-cyclopentylene group, a 1,4-cyclohexylene group, and a 1,5-cyclooctylene group; a polycyclic cycloalkylene group such as a 1,4-norbornylene group, a 2,5-norbornylene group, a 1,5-adamantylene group, and 2,6-adamantylene group; and the like.

Examples of the trivalent alicyclic hydrocarbon group include a group from which one hydrogen atom in the functional group is eliminated, and the like.

Examples of the structure for a case in which D is an alicyclic hydrocarbon group include a structure in which an oxygen atom of (meth)acrylic acid constituting the polymer and a carbon atom constituting the cyclic carbonic acid ester are bonded to each other via a cyclopentylene group (see, the repeating unit (4b-10) described below), a structure in which the bonding is made via a norbornylene group (see, the repeating units (4b-11) and (4b-12) described below), a structure in which the bonding is made via a substituted tetradecahydrophenanthryl group (see, the repeating unit (4b-14) described below), and the like.

Further, the repeating units (4b-11) and (4b-12) described below are examples of a fused ring (4- or 5-membered ring) in which a carbon atom included in D and two carbon atoms constituting the cyclic carbonic acid ester are included. Meanwhile, the repeating units (4b-10) and (4b-14) described below are examples of a spiro ring that is formed with a carbon atom included in D and a carbon atom constituting the cyclic carbonic acid ester.

The term "aromatic hydrocarbon group" means a hydrocarbon group which contains, in the ring structure, an aromatic ring structure, with the proviso that, it is not necessarily required for the aromatic hydrocarbon group to be constituted only with an aromatic ring structure, and it may have a chained structure or an alicyclic hydrocarbon structure in the part thereof.

Examples of the divalent aromatic hydrocarbon group include an arylene group such as a phenylene group, a tolylene group, a naphthylene group, a phenanthrylene group, and an anthrylene group; and the like.

Examples of the trivalent aromatic hydrocarbon group include a group from which one hydrogen atom in the functional group is eliminated, and the like.

Examples of the structure for a case in which D is an aromatic hydrocarbon group include a structure in which an oxygen atom of a (meth)acrylic acid constituting the polymer and a carbon atom constituting the cyclic carbonic acid ester are bonded to each other via a benzylene group (see, the repeating unit (4b-15) described below), and the like. The repeating unit (4b-15) is an example of a fused ring (6-membered ring) in which a carbon atom included in D and two carbon atoms constituting the cyclic carbonate structure are included.

A monomer for giving the repeating unit represented by the general formula (4b) may be synthesized by a method known in the prior art, for example the method described in Tetrahedron Letters, Vol. 27, No. 32 p. 3741 (1986) or Organic Letters, Vol. 4, No. 15 p. 2561 (2002).

As the repeating unit represented by the general formula (4b), the following repeating units (4b-1) to (4b-22) that are represented by the general formula (4b-1) to (4b-22) respectively are particularly preferred. It is noted that $R^{12}$ in the general formula (4b-1) to (4b-22) has the same meaning as $R^{12}$ in the general formula (4b).

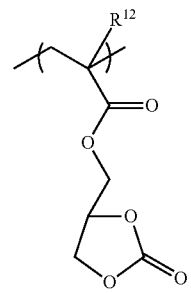

(4b-1)

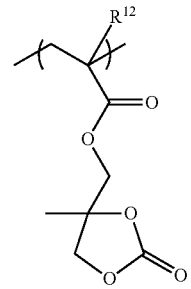

(4b-2)

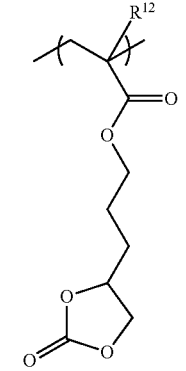

(4b-3)

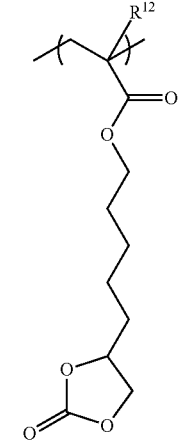

(4b-4)

(4b-5) 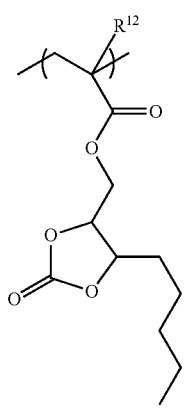
(4b-6) 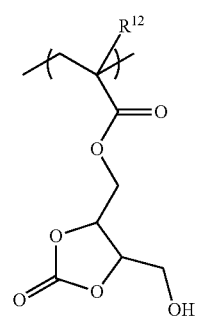
(4b-7) 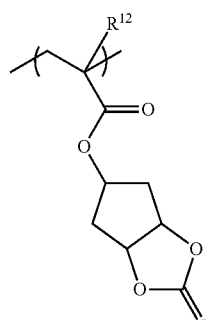
(4b-8) 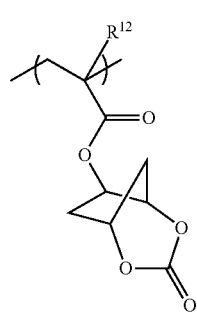
(4b-9) 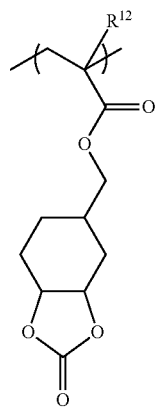
(4b-10) 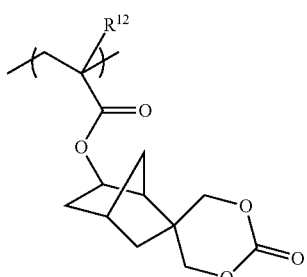
(4b-11) 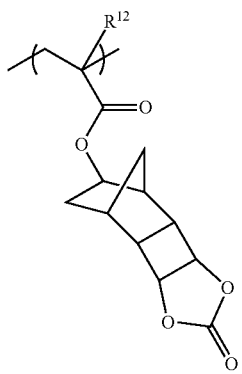
(4b-12) 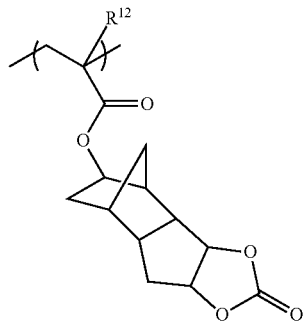

(4b-13)
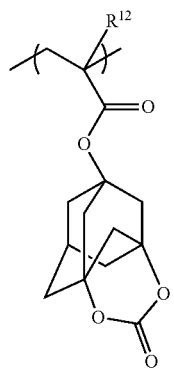
(4b-14)
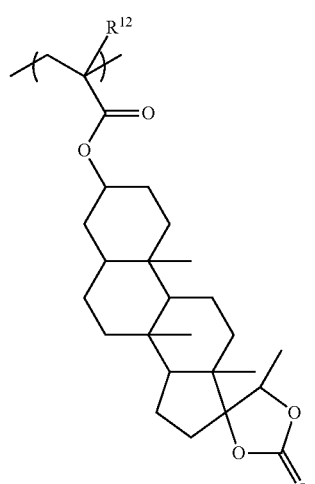
(4b-15)
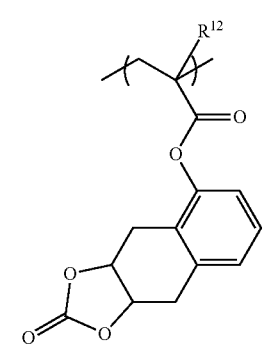
(4b-16)
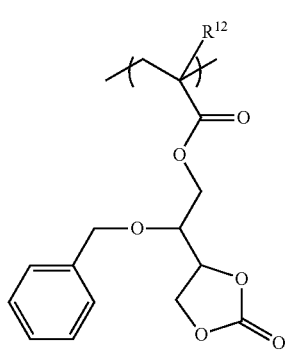
(4b-17)
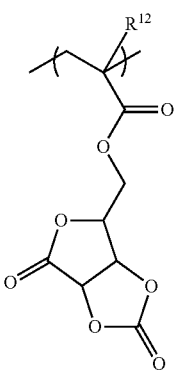
(4b-18)
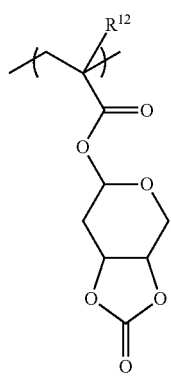
(4b-19)
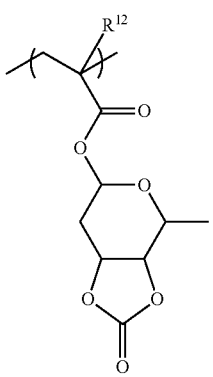
(4b-20)
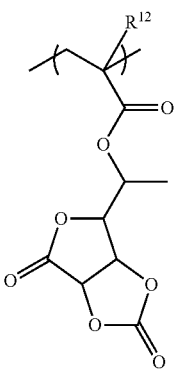

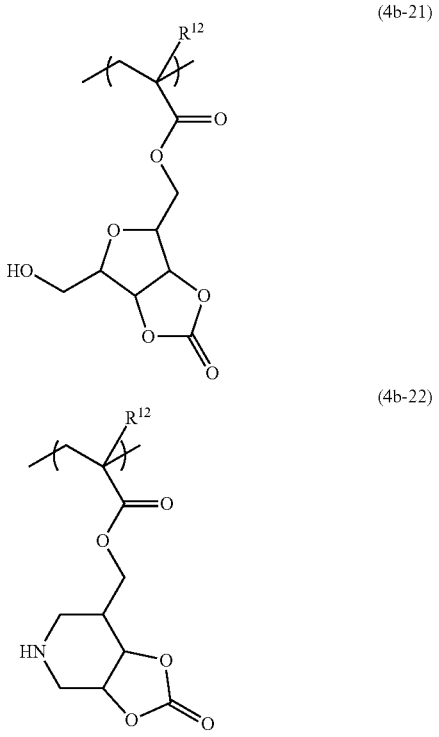

In particular, the polymer (A) preferably contains at least one repeating unit among the repeating units represented by the general formulae (4a-1) to (4a-6) and the repeating unit represented by the general formula (4b-1). This case is preferable from the viewpoint of improving solubility in a developer.

The polymer (A) may have only one kind of the repeating unit (4) or two or more kinds thereof.

Hereinafter, a preferable content ratio of each repeating unit is given below when the total of the repeating units contained in the polymer (A) of the present invention is 100% by mol.

The content ratio of the repeating unit (1) is preferably in the range from 20% to 90% by mol, more preferably from 20% to 80% by mol, and further preferably from 20% to 70% by mol. When the content ratio thereof is within this range, it is particularly effective from the viewpoint of having water repellency after coating and increasing the affinity to a developer after PEB.

The content ratio of the repeating unit (2) is usually 80% or less by mol, preferably in the range from 20% to 80%, and more preferably from 30% to 70% by mol. When the content ratio thereof is within this range, it is particularly effective from the viewpoint of decreasing a difference between an advancing contact angle and a receding contact angle.

The content ratio of the repeating unit (3) is usually 50% or less by mol, preferably in the range from 5% to 30%, and more preferably from 5% to 20% by mol. When the content ratio thereof is within this range, it is particularly effective from the viewpoint of having water repellency after coating and increasing the affinity to a developer after PEB.

The content ratio of the repeating unit (4) is usually 50% or less by mol, preferably in the range from 5% to 30%, and more preferably from 5% to 20% by mol. When the content ratio thereof is within this range, it is particularly effective from the viewpoint of having water repellency after coating and increasing the affinity to a developer after PEB.

Additionally, the polymer (A) can be produced by polymerizing polymerizable unsaturated monomers corresponding to each specified repeating unit in the presence of a chain transfer agent as required, using a radical polymerization initiator such as a hydroperoxide, a dialkyl peroxide, a diacyl peroxide, and an azo compound in an appropriate solvent.

Examples of the solvent used for polymerization include an alkane such as n-pentane, n-hexane, n-heptane, n-octane, n-nonane, and n-decane; a cycloalkane such as cyclohexane, cycloheptane, cyclooctane, decalin and norbornane; an aromatic hydrocarbon such as benzene, toluene, xylene, ethyl benzene, and cumene; a halogenated hydrocarbon such as chlorobutanes, bromohexanes, dichloroethanes, hexamethylene dibromide and chlorobenzene; a saturated carboxylic acid ester such as ethyl acetate, n-butyl acetate, i-butyl acetate, and methyl propionate; a ketone such as acetone, 2-butanone, 4-methyl-2-pentanone and 2-heptanone; an ether such as tetrahydrofuran, dimethoxyethanes and diethoxyethanes; an alcohol such as methanol, ethanol, 1-propanol, 2-propanol, and 4-methyl-2-pentanol; and the like.

These solvents may be used singly or in combination of two or more types thereof.

The polymerization temperature is preferably in the range from 40° C. to 150° C., and more preferably from 50° C. to 120° C. The reaction time is preferably in the range from 1 to 48 hours, and more preferably from 1 to 24 hours.

Additionally, the polystyrene-reduced weight average molecular weight (hereinafter, referred to as "Mw") of the polymer (A) determined by gel permeation chromatography (GPC) is preferably in the range from 1,000 to 50,000, more preferably from 1,000 to 40,000, and still more preferably from 1,000 to 30,000. If the Mw of the polymer (A) is less than 1,000, a resist film having a sufficient receding contact angle may not be obtained. On the other hand, if the Mw of the polymer (A) exceeds 50,000, the developability of the resulting resist film may be deteriorated.

The ratio (Mw/Mn) of the Mw to the polystyrene-reduced number average molecular weight (hereinafter, referred to as "Mn") of the polymer (A) determined by GPC is preferably in the range from 1 to 5, and more preferably from 1 to 4.

It is preferable that the polymer (A) contains almost no impurities such as halogens and metals. A small amount of impurities can provide a resist film leading to improved sensitivity, resolution, process stability, pattern shape and the like.

The polymer (A) can be purified by a chemical purification method such as washing with water and liquid-liquid extraction, a combination of the chemical purification method and a physical purification method such as ultrafiltration and centrifugation.

Examples of the solvent for liquid-liquid extraction include an alkane such as n-pentane, n-hexane, n-heptane, n-octane, n-nonane, and n-decane; an alcohol such as methanol, ethanol, 1-propanol, 2-propanol, and 4-methyl-2-pentanol; and a ketone such as acetone, 2-butanone, 4-methyl-2-pentanone and 2-heptanone. Among these, n-hexane, n-heptane, methanol, ethanol, acetone, and 2-butanone are preferable.

The content of the polymer (A) in the radiation sensitive resin composition is preferably in the range from 0.1 to 20 parts by mass, and more preferably from 0.5 to 15 parts by mass, based on 100 parts by mass of the polymer (B) described below. When the content thereof is in the range from 0.1 to 20 parts by mass, a resist film having a receding contact angle at sufficient level, a small contact angle of a developer after PEB, and little elution of an acid generator and the like can be formed. In addition, if the content of the polymer (A) is less than 0.1 part by mass, the receding contact angle at the resist film formed may not be sufficient and it may be difficult to obtain a resist film having little elution of an acid generator, and the like. On the other hand, if the content of the polymer (A) is more than 20 parts by mass, there is a possibility that only a small depth of focus is obtained from an isolated line (i.e. line part) when a line and space pattern is formed, or development defects may occur.

The radiation sensitive resin composition of the present invention may contain one kind of the polymer (A) or two or more kinds thereof.

(1-2) Polymer (B)

The polymer (B) is a polymer which has an acid labile group and is dissociated by an action of acid so that alkali solubility is given by dissociation of the acid labile group.

The polymer (B) is not particularly limited so long as it has an acid labile group, and the acid labile group is preferably a group which contains a cyclic hydrocarbon group in the structure. Such polymer (B) is advantageous in that it exhibits high sensitivity as the acid labile group dissociates easily.

Examples of the group containing a cyclic hydrocarbon group in the structure include a 2-(2-methyl)cyclopentyl group, a 2-(2-ethyl)cyclopentyl group, a 2-(2-n-propyl)cyclopentyl group, a 2-(2-isopropyl)cyclopentyl group, a 2-(2-methyl)cyclohexyl group, a 2-(2-ethyl)cyclohexyl group, a 2-(2-methyl)cyclooctyl group, a 2-(2-ethyl)cyclooctyl group, a 2-(2-methyl)adamantyl group, a 2-(2-ethyl)adamantyl group, a 2-(2-n-propyl)adamantyl group, a 2-(2-isopropyl) adamantyl group; a group in which these alicyclic group is substituted with one or more linear, branched or cyclic alkyl groups having 1 to 4 carbon atoms such as a methyl group, an ethyl group, a n-propyl group, an i-propyl group, a n-butyl group, a 2-methylpropyl group, and a t-butyl group; and the like. Of these, from the viewpoint of easy dissociation of an acid labile group, ethylcyclopentyl is preferable.

Examples of the polymer (B) include a polymer having an alicyclic skeleton such as norbornane ring in the main chain obtained by polymerization of a norbornene derivative and the like, a polymer having a norbornane ring and a maleic anhydride derivative in the main chain obtained by copolymerization of a norbornene derivative and maleic anhydride, a polymer having a norbornane ring and a (meth)acrylic skeleton in the main chain obtained by copolymerization of a norbornene derivative and a (meth)acrylic compound, a polymer having a norbornane ring, a maleic anhydride derivative and a (meth)acrylic skeleton in the main chain obtained by copolymerization of a norbornene derivative, a maleic anhydride and a (meth)acrylic compound, a polymer having a (meth)acrylic skeleton in the main chain obtained by copolymerization of a (meth)acrylic compound, and the like.

The polymer (B) preferably contains the above-mentioned repeating unit (2) having an acid labile group.

The content ratio of the repeating unit (2) in the polymer (B) is preferably in the range from 10% to 70% by mol, more preferably from 15% to 60% by mol, and further preferably from 20% to 50% by mol, based on 100% by mol of the total of the repeating units contained in the polymer (B). If the content ratio is less than 10% by mol, resolution of the resist film formed may be lowered. On the other hand, if the content ratio is exceeding 70% by mol, developability and exposure margin may be impaired.

The polymer (B) preferably contains further a repeating unit having a lactone skeleton (hereinafter, referred to as "lactone skeleton-containing repeating unit"). When the lactone skeleton-containing repeating unit is contained, adhesion on a base of a resist film can be improved.

Examples of a monomer for constituting the lactone skeleton-containing repeating unit include the above-exemplified compounds represented by the formulae (4a-1) to (4a-6), and the like.

The content ratio of the lactone skeleton-containing repeating unit in the polymer (B) is preferably in the range from 5% to 85% by mol, more preferably from 10% to 70% by mol, and further preferably from 15% to 60% by mol, based on 100% by mol of the total of the repeating units contained in the polymer (B). If the content ratio is less than 5% by mol, adhesion may be lowered at the time of development. On the other hand, if the content ratio is exceeding 85% by mol, solubility of the polymer (B) in a solvent may be impaired. Further, resolution may be deteriorated.

Additionally, the polymer (B) can be produced by polymerizing polymerizable unsaturated monomers corresponding to each specified repeating unit in the presence of a chain transfer agent as required, using a radical polymerization initiator such as a hydroperoxide, a dialkyl peroxide, a diacyl peroxide, and an azo compound in an appropriate solvent.

Examples of the solvent used for polymerization of the polymer (B) include an alkane such as n-pentane, n-hexane, n-heptane, n-octane, n-nonane, and n-decane; a cycloalkane such as cyclohexane, cycloheptane, cyclooctane, decalin and norbornane; an aromatic hydrocarbon such as benzene, toluene, xylene, ethyl benzene, and cumene; a halogenated hydrocarbon such as chlorobutanes, bromohexanes, dichloroethanes, hexamethylene dibromide and chlorobenzene; a saturated carboxylic acid ester such as ethyl acetate, n-butyl acetate, i-butyl acetate, and methyl propionate; a ketone such as acetone, 2-butanone, 4-methyl-2-pentanone and 2-heptanone; an ether such as tetrahydrofuran, dimethoxyethanes and diethoxyethanes; and the like.

These solvents may be used singly or in combination of two or more types thereof.

The polymerization temperature is preferably in the range from 40° C. to 150° C., and more preferably from 50° C. to 120° C. The reaction time is preferably in the range from 1 to 48 hours, and more preferably from 1 to 24 hours.

The Mw of the polymer (B) determined by GPC method is preferably in the range from 1,000 to 100,000, more preferably from 1,000 to 30,000, and still more preferably from 1,000 to 20,000. If the Mw of the polymer (B) is less than 1,000, heat resistance of a resist film formed may be deteriorated. On the other hand, if the Mw of the polymer (B) exceeds 100,000, the developability of the resulting resist film may be deteriorated.

The ratio (Mw/Mn) of the Mw to the Mn of the polymer (B) is preferably in the range from 1 to 5, and more preferably from 1 to 3.

The preferable polymer (B) is one in which the content ratio of a low molecular weight component (hereinafter, also referred to as "low molecular weight component (b)") in the polymer (B), which is derived from a monomer used for producing the polymer (B), is 0.1% or less by mass (in solid matter) based on 100% by mass of the polymer (B). It is more preferably 0.07% or less by mass, and further preferably 0.05% or less by mass. When the content ratio is 0.1% or less by weight, an amount of an eluent that is eluted in a liquid for liquid immersion exposure such as water, which is in contact with a resist film at the time of liquid immersion exposure process, can be reduced. In addition, undesirable substance hardly forms during storage of the radiation sensitive resin composition, uneven coating hardly occurs at the coating, and also an occurrence of defects can be inhibited when a resist pattern is formed.

The low molecular weight component (b) is a component having weight average molecular weight of 500 or less, and example thereof includes a monomer, a dimer, a trimer, and an oligomer. The low molecular weight component (b) can be removed by a chemical purification method such as washing with water and liquid-liquid extraction, a combination of the chemical purification method and a physical purification method such as ultrafiltration and centrifugation.

It is preferable that the polymer (B) contains almost no impurities such as halogens and metals. A small amount of impurities can provide a resist film leading to improved sensitivity, resolution, process stability, pattern shape and the like.

The polymer (B) can be purified, as mentioned above, by a chemical purification method such as washing with water and liquid-liquid extraction, a combination of the chemical purification method and a physical purification method such as ultrafiltration and centrifugation.

The radiation sensitive resin composition of the present invention may contain one kind of the polymer (B) or two or more kinds thereof.

(1-3) Acid Generator (C)

The acid generator (C) generates an acid upon exposure. The acid generator causes dissociation of an acid labile group in an acid labile group containing repeating unit which is present in a resin component (elimination of a protective group) due to an acid generated upon exposure, so that the exposed area of the resist film becomes readily soluble in an alkaline developer. This makes it possible to form a positive-tone resist pattern.

As the acid generator, the following compound represented by the general formula (5) is preferably contained.

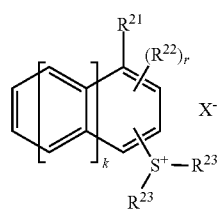

(5)

In the general formula (5), k represents an integer of 0 to 2.

Additionally, $R^{21}$ represents a hydrogen atom, a fluorine atom, a hydroxyl group, a linear or branched alkyl group having 1 to 10 carbon atoms, a linear or branched alkoxyl group having 1 to 10 carbon atoms, or a linear or branched alkoxycarbonyl group having 2 to 11 carbon atoms.

Further, $R^{22}$ represents a linear or branched alkyl group having 1 to 10 carbon atoms, a linear or branched alkoxyl group having 1 to 10 carbon atoms, or a linear, branched, or cyclic alkanesulfonyl group having 1 to 10 carbon atoms. It is noted that r represents an integer of 0 to 2.

Furthermore, $R^{23}$ individually represent a linear or branched alkyl group having 1 to 10 carbon atoms, a substituted or unsubstituted phenyl group, a substituted or unsubstituted naphtyl group, or a substituted or unsubstituted divalent group having 2 to 10 carbon atoms by binding two $R^{23}$.

Moreover, $X^-$ represents an anion represented by $R^{24}C_nF_{2n}SO_3^-$ or $R^{25}SO_3^-$ (wherein $R^{24}$ and $R^{25}$ individually represent a fluorine atom, or a substituted or unsubstituted hydrocarbon group having 1 to 12 carbon atoms, and n is an integer from 1 to 10), or an anion represented by the following formulae (6-1) and (6-2).

(6-1)

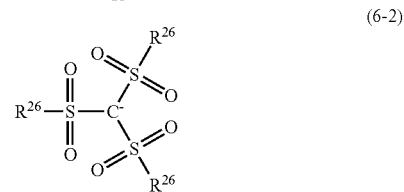

(6-2)

In the general formulae (6-1) and (6-2), $R^{26}$ each independently represents a linear or branched alkyl group having 1 to 10 carbon atoms and a fluorine atom, or two of $R^{26}$ bind to each other and form a divalent organic group having 2 to 10 carbon atoms and a fluorine atom. The organic group may have a substituent.

Examples of the linear or branched alkyl group having 1 to 10 carbon atoms represented by $R^{21}$, $R^{22}$, and $R^{23}$ in the general formula (5) include a methyl group, an ethyl group, a n-butyl group, a 2-methylpropyl group, a 1-methylpropyl group, a t-butyl group, a n-pentyl group, and the like. Among these, a methyl group, an ethyl group, a n-butyl group, and a t-butyl group are preferable.

Examples of the linear or branched alkoxyl group having 1 to 10 carbon atoms represented by $R^{21}$ and $R^{22}$ include a methoxy group, an ethoxy group, a n-propoxy group, an i-propoxy group, a n-butoxy group, a 2-methylpropoxy group, a 1-methylpropoxy group, a t-butoxy group, and the like. Among these, a methoxy group, an ethoxy group, a n-propoxy group, and a n-butoxy group are preferable.

Examples of the linear or branched alkoxycarbonyl group having 2 to 11 carbon atoms represented by $R^{21}$ include a methoxycarbonyl group, an ethoxycarbonyl group, a n-propoxycarbonyl group, an i-propoxycarbonyl group, a n-butoxycarbonyl group, a 2-methylpropoxycarbonyl group, an 1-methylpropoxycarbonyl group, a t-butoxycarbonyl group, and the like. Among these, a methoxycarbonyl group, an ethoxycarbonyl group, and a n-butoxycarbonyl group are preferable.

Examples of the linear, branched, or cyclic alkanesulfonyl group having 1 to 10 carbon atoms represented by $R^{31}$ include a methanesulfonyl group, an ethanesulfonyl group, a n-propanesulfonyl group, a n-buthanesulfonyl group, a tert-butane-sulfonyl group, a cyclopentanesulfonyl group, a cyclohexanesulfonyl group, and the like. Among these, a methanesylfonyl group, an ethanesulfonyl group, a n-propanesulfonyl group, a n-butanesulfonyl group, a cyclopentansulfonyl group, and a cyclohexanesulfonyl group are preferable.

Additionally, r in the general formula (5) represents an integer of 0 to 10, and is preferably 0 to 2.

Examples of the substituted or unsubstituted phenyl group represented by $R^{32}$ in the general formula (5) include a phenyl group such as a phenyl group, a 4-ethylphenyl group, a 4-t-butylphenyl group, a 4-cyclohexylphenyl group, and a 4-fluorophenyl group; a phenyl group substituted with a linear, branched, or cyclic alkyl group having 1 to 10 carbon atoms; a group obtained by substituting a phenyl group or the alkyl-substituted phenyl group with at least one group selected from an alkoxyl group, an alkoxyalkyl group, an alkoxycarbonyl group, and an alkoxycarbonyloxy group, a hydroxyl group, a carboxyl group, a cyano group, a nitro group, or the like.

Examples of the alkoxyl group as a substituent for a phenyl group or the alkyl-substituted phenyl group include linear, branched, or cyclic alkoxyl groups having 1 to 20 carbon atoms, such as a methoxy group, an ethoxy group, a n-propoxy group, a t-butoxy group, a cyclopentyloxy group, and a cyclohexyloxy group, and the like.

Examples of the alkoxyalkyl group include linear, branched, or cyclic alkoxyalkyl groups having 2 to 21 carbon atoms, such as a methoxymethyl group, an ethoxymethyl group, a 1-methoxyethyl group, a 2-methoxyethyl group, a 1-ethoxyethyl group, and a 2-ethoxyethyl group, and the like.

Additionally, examples of the alkoxycarbonyl group include linear, branched, or cyclic alkoxycarbonyl groups having 2 to 21 carbon atoms, such as a methoxycarbonyl group, an ethoxycarbonyl group, a n-propoxycarbonyl group, an i-propoxycarbonyl group, a n-butoxycarbonyl group, a 2-methylpropoxycarbonyl group, a 1-methylpropoxycarbonyl group, a t-butoxycarbonyl group, a cyclopentyloxycarbonyl group, and a cyclohexyloxycarbonyl group, and the like.

Further, examples of the alkoxycarbonyloxy group include linear, branched, or cyclic alkoxycarbonyloxy groups having 2 to 21 carbon atoms, such as a methoxycarbonyloxy group, an ethoxycarbonyloxy group, a n-propoxycarbonyloxy group, an i-propoxycarbonyloxy group, a n-butoxycarbonyloxy group, a t-butoxycarbonyloxy group, a cyclopentyloxycarbonyl group, and a cyclohexyloxycarbonyl group, and the like.

Among the above substituted or unsubstituted phenyl groups as $R^{23}$, a phenyl group, a 4-cyclohexylphenyl group, a 4-t-butylphenyl group, a 4-methoxyphenyl group, and a 4-t-butoxyphenyl group are preferable.

Examples of the substituted or unsubstituted naphthyl group represented by $R^{23}$ include a naphthyl group; naphthyl groups substituted with a linear, branched, or cyclic alkyl group having 1 to 10 carbon atoms, such as a 2-methyl-1-naphthyl group, a 3-methyl-1-naphthyl group, a 4-methyl-1-naphthyl group, a 5-methyl-1-naphthyl group, a 6-methyl-1-naphthyl group, a 7-methyl-1-naphthyl group, a 8-methyl-1-naphthyl group, a 2,3-dimethyl-1-naphthyl group, a 2,4-dimethyl-1-naphthyl group, a 2,5-dimethyl-1-naphthyl group, a 2,6-dimethyl-1-naphthyl group, a 2,7-dimethyl-1-naphthyl group, a 2,8-dimethyl-1-naphthyl group, a 3,4-dimethyl-1-naphthyl group, a 3,5-dimethyl-1-naphthyl group, a 3,6-dimethyl-1-naphthyl group, a 3,7-dimethyl-1-naphthyl group, a 3,8-dimethyl-1-naphthyl group, a 4,5-dimethyl-1-naphthyl group, a 5,8-dimethyl-1-naphthyl group, a 4-ethyl-1-naphthyl group, a 2-naphthyl group, a 1-methyl-2-naphthyl group, a 3-methyl-2-naphthyl group, and a 4-methyl-2-naphthyl group; a group obtained by substituting a naphthyl group or the alkyl-substituted naphthyl group with at least one group selected from a hydroxyl group, a carboxyl group, a cyano group, a nitro group, an alkoxyl group, an alkoxyalkyl group, an alkoxycarbonyl group, and an alkoxycarbonyloxy group; and the like.

Examples of the substituent which substitutes a naphthyl group or an alkyl-substituted naphthyl group include the groups mentioned above in connection with a phenyl group and the alkyl-substituted phenyl group.

Among the above substituted or unsubstituted naphthyl groups as $R^{23}$, a 1-naphthyl group, a 1-(4-methoxynaphthyl) group, a 1-(4-ethoxynaphthyl) group, a 1-(4-n-propoxynaphthyl) group, a 1-(4-n-butoxynaphthyl) group, a 2-(7-methoxynaphthyl) group, a 2-(7-ethoxynaphthyl) group, a 2-(7-n-propoxynaphthyl) group, and a 2-(7-n-butoxynaphthyl) group are preferable.

The substituted or unsubstituted divalent group having 2 to 10 carbon atoms formed when two $R^{23}$ bond to each other is preferably a group that forms a five or six-membered ring (particularly preferably a five-membered ring (i.e., tetrahydrothiophene ring)) together with the sulfur atom in the compound represented by the general formula (5).

Examples of a substituent for the divalent group include the groups (e.g., hydroxyl group, carboxyl group, cyano group, nitro group, alkoxyl group, alkoxyalkyl group, alkoxycarbonyl group, and alkoxycarbonyloxy group) mentioned above in connection with a phenyl group and the alkyl-substituted phenyl group.

$R^{32}$ is preferably a methyl group, an ethyl group, a phenyl group, a 4-methoxyphenyl group, a 1-naphthyl group, and a divalent group in which two $R^{32}$ bond to each other to form a tetrahydrothiophene ring structure together with the sulfur atom.

When $X^-$ in the general formula (5) is an anion represented by $R^{24}C_nF_{2n}SO_3^-$, $C_nF_{2n}^-$ group is a perfluoroalkyl group having n carbon atoms. This group may be either linear or branched. n is preferably 1, 2, 4, or 8.

The substituted or unsubstituted hydrocarbon group having 1 to 12 carbon atoms represented by $R^{24}$ and $R^{25}$ is preferably an alkyl group having 1 to 12 carbon atoms, a cycloalkyl group, and a bridged alicyclic hydrocarbon group.

Specifically, a methyl group, an ethyl group, a n-propyl group, an i-propyl group, a n-butyl group, a 2-ethylhexyl group, a n-nonyl group, a n-decyl group, a norbornyl group, a norbornylmethyl group, a hydroxynorbornyl group, and an adamantyl group are preferable.

Examples of $R^{26}$ in the case where it is the linear or branched alkyl group having 1 to 10 carbon atoms and a fluorine atom in the general formulae (6-1) and (6-2) include a trifluoromethyl group, a pentafluoroethyl group, a heptafluoropropyl group, a nonafluorobutyl group, a dodecafluoropentyl group, a perfluorooctyl group, and the like.

In addition, examples of the group in the case where two of $R^{26}$ bind to each other and form a divalent organic group which has 2 to 10 carbon atoms and a fluorine atom and may have a substituent include a tetrafluoroethylene group, a hexafluoropropylene group, an octafluorobutylene group, a decafluoropentylene group, an undecafluorohexylene group, and the like.

Specifically, $X^-$ is preferably a trifluoromethane sulfonate anion, a perfluoro-n-butane sulfonate anion, a perfluoro-n-octane sulfonate anion, a 2-bicyclo[2.2.1]hept-2-yl-1,1,2,2-tetrafluoroethane sulfonate anion, a 2-bicyclo[2.2.1]hept-2-yl-1,1-difluoroethane sulfonate anion, or anions represented by the following formulae (7-1) to (7-7).

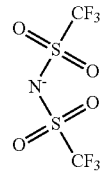

(7-1)

(7-2) 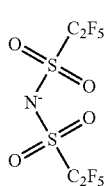

(7-3) 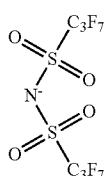

(7-4) 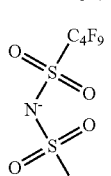

(7-5) 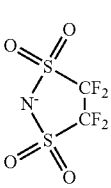

(7-6) 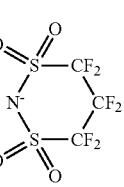

(7-7) 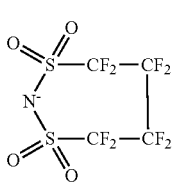

Specific examples of the preferable compound represented by the general formula (5) include triphenylsulfonium trifluoromethane sulfonate, tri-tert-butylphenylsulfonium trifluoromethane sulfonate, 4-cyclohexylphenyl-diphenylsulfonium trifluoromethane sulfonate, 4-methanesulfonylphenyl-diphenylsulfonium trifluoromethane sulfonate, 1-(3,5-dimethyl-4-hydroxyphenyptetrahydrothiopheniumtrifluoromethane sulfonate, 1-(4-n-butoxynaphthyptetrahydrothiopheniumtrifluoromethane sulfonate, triphenylsulfonium perfluoro-n-butane sulfonate, tri-tert-butylphenylsulfonium perfluoro-n-butane sulfonate, 4-cyclohexylphenyl-diphenylsulfonium perfluoro-n-butane sulfonate, 4-methanesulfonylphenyl-diphenylsulfonium perfluoro-n-butane sulfonate, 1-(3,5-dimethyl-4-hydroxyphenyetetrahydrothiophenium perfluoro-n-butane sulfonate, 1-(4-n-butoxynaphthyl)tetrahydrothiophenium perfluoro-n-butane sulfonate, triphenylsulfonium perfluoro-n-octane sulfonate, tri-tert-butylphenylsulfonium perfluoro-n-octane sulfonate, 4-cyclohexylphenyl-diphenylsulfonium perfluoro-n-octane sulfonate, 4-methanesulfonylphenyl-diphenylsulfonium perfluoro-n-octane sulfonate, 1-(3,5-dimethyl-4-hydroxyphenyl)tetrahydrothiophenium perfluoro-n-octane sulfonate, 1-(4-n-butoxynaphthyl)tetrahydrothiophenium perfluoro-n-octane sulfonate, triphenylsulfonium 2-(bicyclo[2.2.1]hepta-2'-yl)-1,1,2,2-tetrafluoroethane sulfonate, tri-tert-butylphenylsulfonium 2-(bicyclo[2.2.1]hepta-2'-yl)-1,1,2,2-tetrafluoroethane sulfonate, 4-cyclohexylphenyl-diphenylsulfonium 2-(bicyclo[2.2.1]hepta-2'-yl)-1,1,2,2-tetrafluoroethane sulfonate, 4-methanesulfonylphenyl-diphenylsulfonium 2-(bicyclo[2.2.1]hepta-2'-yl)-1,1,2,2-tetrafluoroethane sulfonate, 1-(3,5-dimethyl-4-hydroxyphenyl)tetrahydrothiophenium 2-(bicyclo[2.2.1]hepta-2'-yl)-1,1,2,2-tetrafluoroethane sulfonate, 1-(4-n-butoxynaphthyl)tetrahydrothiophenium 2-(bicyclo[2.2.1]hepta-2'-yl)-1,1,2,2-tetrafluoroethane sulfonate, triphenylsulfonium 2-(bicyclo[2.2.1]hepta-2'-yl)-1,1-difluoroethane sulfonate, tri-tert-butylphenylsulfonium 2-(bicyclo[2.2.1]hepta-2'-yl)-1,1-difluoroethane sulfonate, 4-cyclohexylphenyl-diphenylsulfonium 2-(bicyclo[2.2.1]hepta-2'-yl)-1,1-difluoroethane sulfonate, 4-methanesulfonylphenyl-diphenylsulfonium 2-(bicyclo[2.2.1]hepta-2'-yl)-1,1-difluoroethane sulfonate, 1-(3,5-dimethyl-4-hydroxyphenyetetrahydrothiophenium 2-(bicyclo[2.2.1]hepta-2'-yl)-1,1-difluoroethane sulfonate, 1-(4-n-butoxynaphthyl)tetrahydrothiophenium 2-(bicyclo[2.2.1]hepta-2'-yl)-1,1-difluoroethane sulfonate, the following compounds represented by the formulae (c1) to (c15), and the like.

The compound represented by the general formula (5) may be used singly or in combination of two or more types thereof.

(c1) 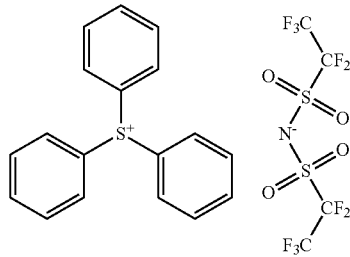

(c2) 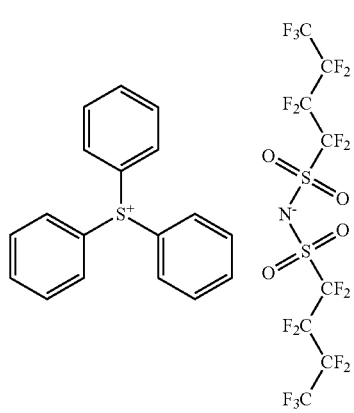

39
-continued
(c3)
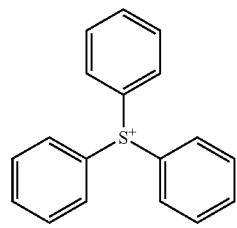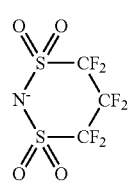
(c4)
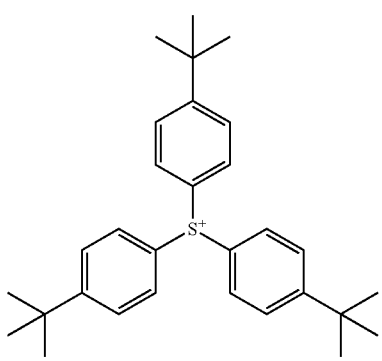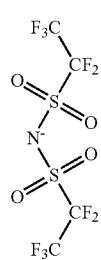
(c5)
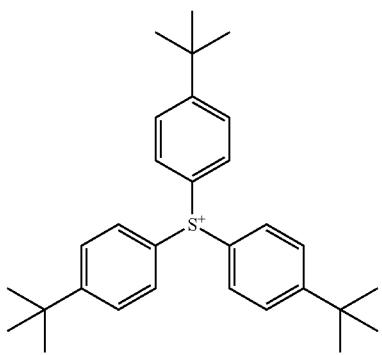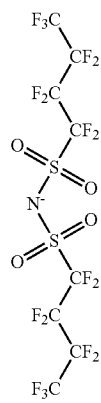
(c6)
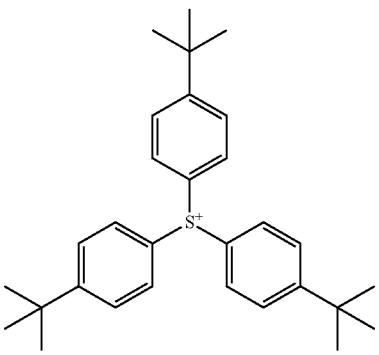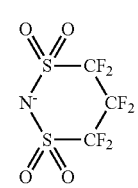
40
-continued
(c7)
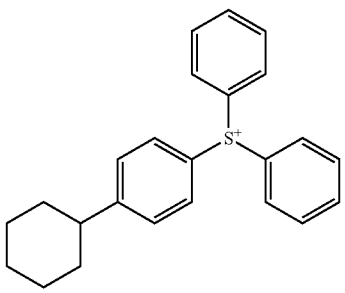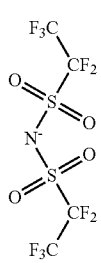
(c8)
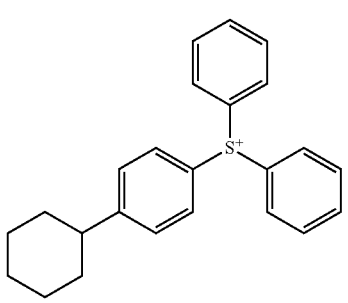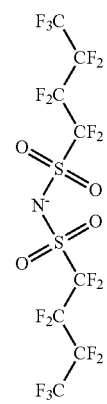
(c9)
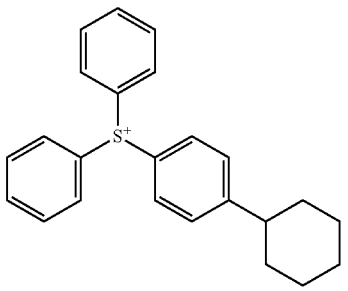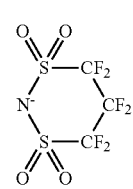
(c10)
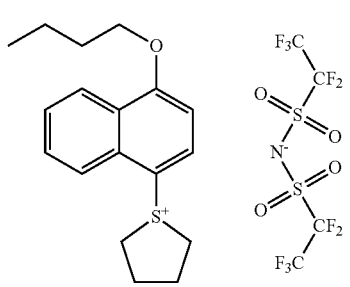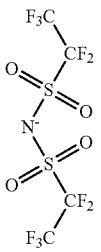

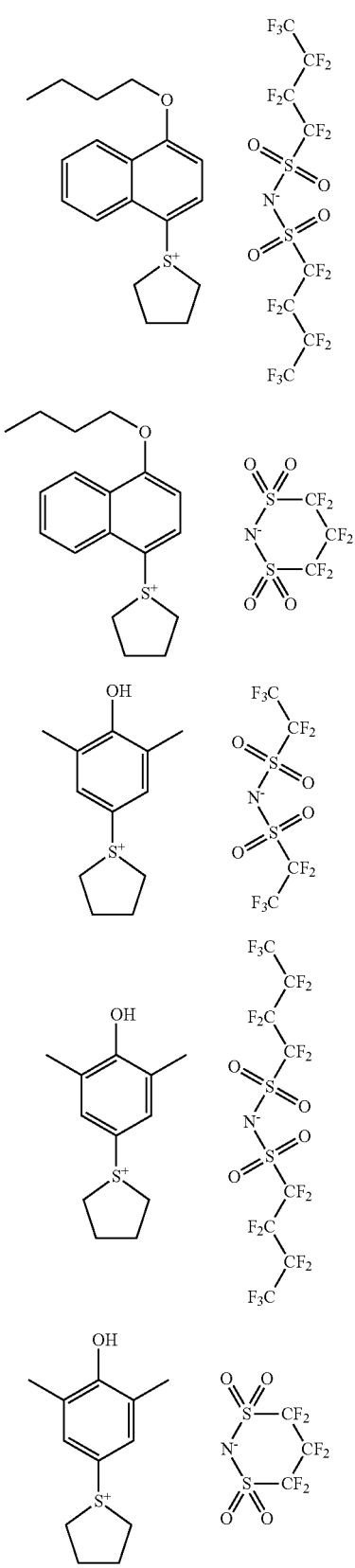

Examples of the acid generator (C) include, in addition to the compound represented by the general formula (5), other acid generators such as an onium salt compound, a halogen containing compound, a diazoketone compound, a sulfone compound, and a sulfonic acid compound.

The other acid generators may be used singly or in combination of two or more types thereof.

The content of the acid generator (C) is preferably in the range from 0.1 to 20 parts by mass, and more preferably from 0.5 to 10 parts by mass, based on 100 parts by mass of the total of the polymer (A) and the polymer (B). When the content is between 0.1 to 20 parts by mass, sensitivity and developability of a formed film can be maintained. If the content of the acid generator (C) is less than 0.1 part by mass, sensitivity and developability may be deteriorated. On the other hand, if the content of the acid generator (C) is more than 20 parts by mass, transparency against radiation rays is reduced so that it may become difficult to obtain a rectangular resist pattern.

When the compound represented by the general formula (5) is used in combination with other acid generator, the content ratio of other acid generator is preferably 80% or less by weight, and more preferably 60% or less by weight when the total of the compound represented by the general formula (5) and other acid generator is 100% by weight.

(1-4) Other Components

The radiation sensitive resin composition of the present invention may contain, in addition to the polymer (A), polymer (B), and acid generator (C), a nitrogen containing compound, a solvent, and various additives such as an alicyclic additive, a surfactant and a sensitizer, if necessary.

<Nitrogen Containing Compound>

The nitrogen containing compound controls a phenomenon in which an acid generated by the acid generator upon exposure is diffused in the resist film, and suppresses undesired chemical reactions in the unexposed area. The nitrogen containing compound improves the storage stability of the resulting radiation sensitive resin composition. Additionally, the nitrogen containing compound improves the resolution of the resulting resist, and suppresses a change in line width of the resist pattern due to a change in post-exposure delay (PED) from exposure to post-exposure bake. This makes it possible to obtain a radiation sensitive resin composition that exhibits excellent process stability.

Examples of the nitrogen containing compound include a tertiary amine compound, an amine compound other than a tertiary amine compound (i.e. other amine compound), an amide group containing compound, a urea compound, a nitrogen containing heterocyclic compound, and the like.

Examples of the tertiary amine compound include a mono(cyclo)alkylamine such as n-hexyl amine, n-heptyl amine, n-octyl amine, n-nonyl amine, n-decyl amine, and cyclohexyl amine; a di(cyclo)alkylamine such as di-n-butyl amine, di-n-pentyl amine, di-n-hexyl amine, di-n-heptyl amine, di-n-octyl amine, di-n-nonyl amine, di-n-decyl amine, cyclohexylmethyl amine, and dicyclohexyl amine; a tri(cyclo)alkylamine such as triethyl amine, tri-n-propyl amine, tri-n-butyl amine, tri-n-pentyl amine, tri-n-hexyl amine, tri-n-heptyl amine, tri-n-octyl amine, tri-n-nonyl amine, tri-n-decyl amine, cyclohexyldimethyl amine, methyldicyclohexyl amine, and tricyclohexyl amine; a substituted alkylamine such as 2,2',2"-nitrotriethanol; aniline, N-methyl aniline, N,N-dimethyl aniline, 2-methyl aniline, 3-methyl aniline, 4-methyl aniline, 4-nitro aniline, diphenyl amine, triphenyl amine, naphthyl amine, 2,4,6-tri-tert-butyl-N-methyl aniline, N-phenyl diethanol amine, 2,6-diisopropyl aniline, and the like.

Examples of the other amine compound include ethylene diamine, N,N,N',N'-tetramethylethylene diamine, tetramethylene diamine, hexamethylene diamine, 4,4'-diamino diphenyl methane, 4,4'-diamino diphenyl ether, 4,4'-diamino benzophenone, 4,4'-diamino diphenyl amine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, bis(2-dimethylaminoethyl)ether, bis(2-diethylaminoethyl)ether, 1-(2-hydroxyethyl)-2-imidazolidinone, 2-quinoxalinol, N,N,N',N'-tetrakis(2-hydroxypropyl)ethylene diamine, N,N,N',N'',N''-pentamethyldiethylene triamine, and the like.

Examples of the amide group containing compound include a N-t-butoxycarbonyl group containing amine compound such as N-t-butoxycarbonyl di-n-octyl amine, N-t-butoxycarbonyl di-n-nonyl amine, N-t-butoxycarbonyl di-n-decyl amine, N-t-butoxycarbonyl dicyclohexyl amine, N-t-butoxycarbonyl-1-adamantyl amine, N-t-butoxycarbonyl-2-adamantyl amine, N-t-butoxycarbonyl-N-methyl-1-adamantyl amine, (S)-(−)-1-(t-butoxycarbonyl)-2-pyrrolidine methanol, (R)-(+)-1-(t-butoxycarbonyl)-2-pyrrolidine methanol, N-t-butoxycarbonyl-4-hydroxypiperidine, N-t-butoxycarbonylpyrrolidine, N-t-butoxycarbonylpiperazine, N-t-butoxycarbonylpiperidine, N,N-di-t-butoxycarbonyl-1-adamantyl amine, N,N-di-t-butoxycarbonyl-N-methyl-1-adamantyl amine, N-t-butoxycarbonyl-4,4'-diaminodiphenylmethane, N,N'-di-t-butoxycarbonyl hexamethylene diamine, N,N,N'N'-tetra-t-butoxycarbonyl hexamethylene diamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonyl benzimidazole, N-t-butoxycarbonyl-2-methyl benzimidazole, and N-t-butoxycarbonyl-2-phenyl benzimidazole; and also formamide, N-methyl formamide, N,N-dimethyl formamide, acetamide, N-methyl acetamide, N,N-dimethyl acetamide, propionamide, benzamide, pyrrolidone, N-methylpyrrolidone, N-acetyl-1-adamantyl amine, tris(2-hydroxyethyl)isocyanurate, and the like.

Examples of the urea compound include urea, methylurea, 1,1-dimethylurea, 1,3-dimethylurea, 1,1,3,3-tetramethylurea, 1,3-diphenylurea, tri-n-butylthiourea, and the like.

Examples of the nitrogen containing heterocyclic compound include an imidazole such as imidazole, 4-methyl imidazole, 4-methyl-2-phenyl imidazole, benzimidazole, 2-phenyl benzimidazole, 1-benzyl-2-methyl imidazole, and 1-benzyl-2-methyl-1H-imidazole; a pyridine such as pyridine, 2-methylpyridine, 4-methylpyridine, 2-ethyl pyridine, 4-ethyl pyridine, 2-phenyl pyridine, 4-phenyl pyridine, 2-methyl-4-phenyl pyridine, nicotine, nicotinic acid amide, quinoline, 4-hydroxyquinoline, 8-oxyquinoline, acridine, and 2,2':6',2''-terpyridine; a piperazine such as piperazine and 1-(2-hydroxyethyl)piperazine; and also pyrazine, pyrazole, pyridazine, quinoxaline, purine, pyrrolidine, piperidine, piperidine ethanol, 3-piperidino-1,2-propane diol, morpholine, 4-methyl morpholine, 1-(4-morpholinyl)ethanol, 4-acetyl morpholine, 3-(N-morpholino)-1,2-propane diol, 1,4-dimethyl piperazine, 1,4-diazabicyclo[2.2.2]octane, and the like.

The nitrogen containing compound may be used singly or in combination of two or more types thereof.

The amount of the nitrogen containing compound to be blended is preferably 15 parts or less by mass, more preferably 10 parts or less by mass, and further preferably 5 parts or less by mass, based on 100 parts by mass of the total of the polymer (A) and polymer (B). If the amount of the nitrogen containing compound to be blended is more than 15 parts by mass, sensitivity of a formed resist film may be lowered.

<Solvent>

The solvent is not particularly limited so long as it dissolves the polymer (A) and polymer (B) to make the radiation sensitive resin composition solution. Example thereof includes a linear or branched ketone such as 2-butanone, 2-pentanone, 3-methyl-2-butanone, 2-hexanone, 4-methyl-2-pentanone, 3-methyl-2-pentanone, 3,3-dimethyl-2-butanone, 2-heptanone, and 2-octanone; a cyclic ketone such as cyclopentanone, 3-methylcyclopentanone, cyclohexanone, 2-methylcyclohexanone, 2,6-dimethylcyclohexanone, and isophorone; a propylene glycol monoalkyl ether acetate such as propylene glycol monomethyl ether acetate, propylene glycol monoethyl ether acetate, propylene glycol mono-n-propyl ether acetate, propylene glycol mono-i-propyl ether acetate, propylene glycol mono-n-butyl ether acetate, propylene glycol mono-i-butyl ether acetate, propylene glycol mono-sec-butyl ether acetate, and propylene glycol mono-t-butyl ether acetate;

an alkyl 2-hydroxypropionate such as methyl 2-hydroxypropionate, ethyl 2-hydroxypropionate, n-propyl 2-hydroxypropionate, i-propyl 2-hydroxypropionate, n-butyl 2-hydroxypropionate, i-butyl 2-hydroxypropionate, sec-butyl 2-hydroxypropionate, and t-butyl 2-hydroxypropionate; an alkyl 3-alkoxypropionate such as methyl 3-methoxypropionate, ethyl 3-methoxypropionate, methyl 3-ethoxypropionate, and ethyl 3-ethoxypropionate;

n-propyl alcohol, i-propyl alcohol, n-butyl alcohol, t-butyl alcohol, cyclohexanol, ethylene glycol monomethyl ether, ethylene glycol monoethyl ether, ethylene glycol mono-n-propyl ether, ethylene glycol mono-n-butyl ether, diethylene glycol dimethyl ether, diethylene glycol diethyl ether, diethylene glycol di-n-propyl ether, diethylene glycol di-n-butyl ether, ethylene glycol monomethyl ether acetate, ethylene glycol monoethyl ether acetate, ethylene glycol mono-n-propyl ether acetate, propylene glycol monomethyl ether, propylene glycol monoethyl ether, propylene glycol mono-n-propyl ether, toluene, xylene, 2-hydroxy-2-methylethylpropionate, ethyl ethoxyacetate, ethyl hydroxyacetate, methyl 2-hydroxy-3-methylbutyrate, 3-methoxybutyl acetate, 3-methyl-3-methoxybutyl acetate, 3-methyl-3-methoxybutyl propionate, 3-methyl-3-methoxybutyl butyrate, ethyl acetate, n-propyl acetate, n-butyl acetate, methyl acetoacetate, ethyl acetoacetate, methyl pyruvate, ethyl pyruvate, N-methylpyrrolidone, N,N-dimethylformamide, N,N-dimethylacetamide, benzyl ethyl ether, di-n-hexyl ether, diethylene glycol monomethyl ether, diethylene glycol monoethyl ether, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, and the like.

Of these, a linear or branched ketone, a cyclic ketone, a propylene glycol monoalkyl ether acetate, an alkyl 2-hydroxypropionate, an alkyl 3-alkoxypropionate, and γ-butyrolactone are preferable.

The solvent may be used singly or in combination of two or more types thereof.

The solvent is added so that the radiation sensitive resin composition of the present invention has a solid content of the preferably range from 1% to 50% by mass, and more preferably from 1% to 25% by mass.

The radiation sensitive resin composition of the present invention can be used as a composition solution after preparing by adding the solvent and then filtering the solution with a filter having a pore diameter of about 0.2 μm, for example.

(1-5) Receding Contact Angle

The radiation sensitive resin composition of the present invention has a receding contact angle of preferably 68 degrees or higher, and more preferably 70 degree or higher, wherein the receding contact angle is an angle between water and a photoresist film which is formed by coating the resin composition on a substrate. When the receding contact angle is lower than 68 degrees, water may not be sufficiently removed during high speed scanning exposure, and therefore a watermark defect may be generated.

The term "receding contact angle" in the present specification refers to a contact angle between a liquid surface and a substrate on which a photoresist film of the resin composition of the present invention is formed, when 25 µl of water is dropped on the substrate and thereafter the water droplet on the substrate is suctioned at a rate of 10 µl/min. Specifically, the receding contact angle can be measured using "DSA-10" (manufactured by KRUS) as described later in Examples.

(1-6) Contact Angle of Developer

In the radiation sensitive resin composition of the present invention, the contact angle of a developer at a photoresist film formed by coating the resin composition on a substrate and then subjecting to PEB is preferably 80 degree or less, and more preferably 75 degree or less. If the contact angle is more than 75 degree, a wetting property for a developer during rinse after development becomes poor, and therefore development detects may be occurred.

The term "contact angle of developer" in the present specification refers to a contact angle between a liquid surface and a substrate on which a photoresist film formed by using the resin composition of the present invention and subjecting to PEB, when 25 µl of a developer is dropped on the substrate. Specifically, the receding contact angle can be measured using "DSA-10" (manufactured by KRUS) as described later in Examples.

[2] Polymer

The polymer of the present invention contains the repeating unit (1) represented by the general formula (1) and the repeating unit (2) having an acid labile group (provided that a unit corresponding to the repeating unit (1) is excluded).

This polymer can be suitably used as the polymer (A) in the radiation sensitive resin composition of the present invention.

As for the "repeating unit (1)" and the "repeating unit (2)", the same explanations as those given to the "repeating unit (1)" and the "repeating unit (2)" of the polymer (A) above can be also given.

The polymer of the present invention may contain only one kind of each repeating unit (1) and repeating unit (2), or the polymer may contain two or more of them.

Further, the polymer of the present invention may contain at least one of the repeating unit (3) and repeating unit (4) in the polymer (A). The polymer of the present invention may contain only one kind of each repeating unit (3) and repeating unit (4), or the polymer may contain two or more of them.

[3] Method of Forming Resist Pattern

The method for the formation of a resist pattern of the present invention is a method including steps of (1) forming a photoresist film on a substrate by using the radiation sensitive resin composition (hereinafter, referred to also as "step (1)"), (2) subjecting the photoresist film to a liquid immersion exposure via a liquid for liquid immersion exposure after setting the liquid for liquid immersion exposure on the photoresist film, (hereinafter, referred to also as "step (2)"), and (3) developing the photoresist film obtained after the liquid immersion exposure process to form a resist pattern (hereinafter, referred to also as "step (3)"). According to such a forming method, a resist pattern having a good pattern shape can be obtained.

In the step (1), a resin composition solution prepared from the radiation sensitive resin composition of the present invention is applied to a substrate (e.g., silicon wafer or silicon dioxide-coated wafer) by an appropriate application method (e.g., rotational coating, cast coating, or roll coating) to form a resist film. Specifically, the radiation-sensitive resin composition solution is applied so that the resulting resist film has a given thickness, and prebaked (PB) to volatilize the solvent from the film to obtain a resist film.

The thickness of the resist film is not particularly limited, but is preferably in the range from 10 to 5,000 nm, and more preferably from 10 to 2,000 nm.

The prebaking temperature is determined depending on the composition of the radiation-sensitive resin composition, but is preferably about in the range from 30° C. to 200° C., and more preferably from 50° C. to 150° C.

In the step (2), a liquid for liquid immersion exposure is set on the photoresist film formed in the step (1) and radiation is irradiated via a liquid for liquid immersion exposure to conduct liquid immersion exposure of the photoresist film.

As the liquid for liquid immersion exposure process, a pure water, a long chained or cyclic aliphatic compound, and the like may be used.

As radiation used for liquid immersion lithography, visible rays, ultraviolet rays, deep ultraviolet rays, X-rays, electron beams, or the like are appropriately selected depending on the type of acid generator to be used. It is preferable to use deep ultraviolet rays by ArF excimer laser light (wavelength: 193 nm) or KrF excimer laser light (wavelength: 248 nm). It is particularly preferable use ArF excimer laser light (wavelength: 193 nm).

The exposure conditions are appropriately selected depending on the blending composition of the radiation sensitive resin composition, the type of additives, and the like.

In the present invention, it is preferable to perform post-exposure bake (PEB) after exposure. PEB ensures smooth dissociation of the acid labile group in the resin component. PEB conditions are appropriately selected depending on the blending composition of the radiation sensitive resin composition. Heating temperature is normally in the range from 30° C. to 200° C., and preferably from 50° C. to 170° C.

In the present invention, an organic or inorganic antireflective film may be formed on the substrate by the method disclosed in, for example, JP-B H6-12452 (JP-A S59-93448, or the like in order to bring out the potential of the radiation sensitive resin composition to a maximum extent. A protective film may be formed on the resist film by the method disclosed in, for example, JP-A 115-188598, or the like in order to prevent an adverse effect of basic impurities and the like contained in the environmental atmosphere. Further, an immersion liquid protective film may also be formed on the photoresist film by the method disclosed in, for example, JP-A 2005-352384, or the like in order to inhibit evolution of an acid generator from the resist film in liquid immersion exposure process. These methods may be used in combination.

Further, according to the method of forming a resist pattern by the liquid immersion exposure process, a resist pattern can be formed from only a resist film obtained using the radiation sensitive resin composition of the present invention, without forming a protective film (i.e. upper layer film) described above on the resist film. When the resist pattern is formed with an upper layer-free resist film, a step of producing a protective film (i.e. upper layer film) can be omitted, and therefore an improvement in throughput can be expected.

In the step (3), the exposed photoresist film is developed to form a pre-determined resist pattern. It is preferable to use an alkaline aqueous solution prepared by dissolving at least one alkaline compound (e.g., sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, or 1,5-diazabicyclo-[4.3.0]-5-nonene) in water as a developer.

The concentration of the alkaline aqueous solution is preferably 10% or less by mass. If the concentration of the alkaline aqueous solution exceeds 10% by mass, the unexposed area may also be dissolved in the developer.

An organic solvent may be added to the alkaline aqueous solution (developer).

Examples of the organic solvent include ketones such as acetone, methyl ethyl ketone, methyl i-butyl ketone, cyclopentanone, cyclohexanone, 3-methylcyclopentanone, and 2,6-dimethylcyclohexanone; alcohols such as methyl alcohol, ethyl alcohol, n-propyl alcohol, i-propyl alcohol, n-butyl alcohol, t-butyl alcohol, cyclopentanol, cyclohexanol, 1,4-hexanediol, and 1,4-hexanedimethylol; ethers such as tetrahydrofuran and dioxane; esters such as ethyl acetate, n-butyl acetate, and i-amyl acetate; aromatic hydrocarbons such as toluene and xylene; phenol, acetonylacetone, dimethylformamide, and the like.

These organic solvents may be used either individually or in combination.

The organic solvent is preferably used in an amount of 100 vol % or less based on 100 vol % of the alkaline aqueous solution. If the amount of the organic solvent exceeds 100 vol %, the exposed area may remain undeveloped due to a decrease in developability.

An appropriate amount of a surfactant and the like may also be added to the alkaline aqueous solution (developer).

After development using the alkaline aqueous solution (developer), the resist film is normally washed with water, and dried.

EXAMPLES

Hereinafter, the invention is further described by way of examples. Note that the invention is not limited to the following examples and the unit "part(s)" refers to "parts by mass" unless otherwise indicated.

1. Synthesis of Polymer (A) and Polymer (B)

Measurements and evaluation in the Synthesis Examples are as follows.

(1) Mn and Mn

The Mw and the Mn based on monodisperse polystyrene were measured by gel permeation chromatography (GPC) using GPC columns manufactured by Tosoh Corp. (G2000HXL×2, G3000HXL×1, G4000HXL×1) under conditions of a flow rate of 1.0 ml/min, eluant of tetrahydrofuran, and column temperature of 40° C. The dispersity "Mw/Mn" was calculated from the results of Mw and Mn.

(2) $^{13}$C-NMR Analysis

Each polymer was subjected to $^{13}$C-NMR analysis using "JNM-EX270" (manufactured by JEOL Ltd.).

Hereinafter, synthesis examples are described.

For the synthesis of polymers (A-1) to (A-14) as the polymer (A), the following compounds (M-1) to (M-13) were used as monomers.

The following compounds (M-1) and (M-2) are monomers leading to the repeating unit (2). The following compounds (M-3) and (M-7) are monomers leading to the repeating unit (1). The following compounds (M-4) to (M-6) are monomers leading to the repeating unit (3). And the following compounds (M-8) to (M-11) are monomers leading to the repeating unit (4).

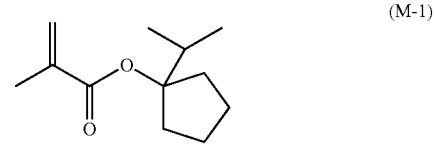

(M-1)

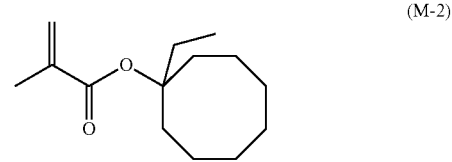

(M-2)

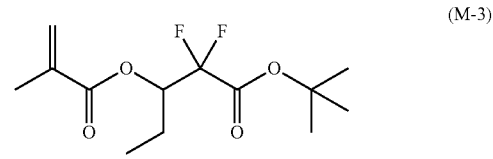

(M-3)

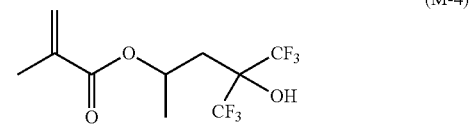

(M-4)

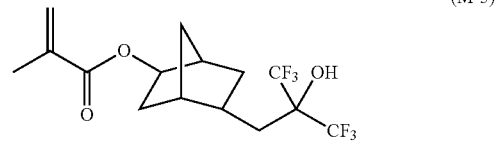

(M-5)

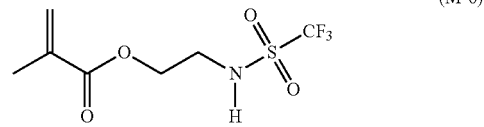

(M-6)

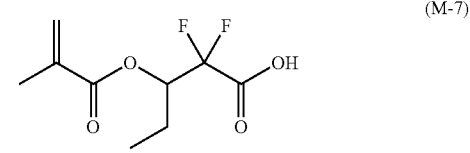

(M-7)

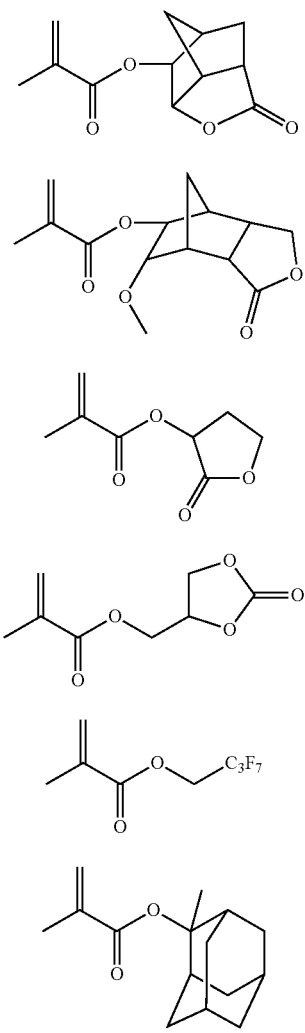

<Synthesis of Polymer (A-1)>

A monomer solution was prepared by dissolving monomers consisting of 25% by mol of the compound (M-3), 60% by mol of the compound (M-1), and 15% by mol of the compound (M-4) and dimethyl 2,2'-azobis isobutyrate (MAIB) as an initiator in 50 g of methyl ethyl ketone. Total amount of the monomers added was 50 g. The % by mol of each monomer represents % by mol based on to the total amount of the monomers, and the usage ratio of the initiator was 8% by mol based on the total amount of the monomers and the initiator.

Meanwhile, 50 g of ethyl methyl ketone was added to a 500 ml three-necked flask equipped with a thermometer and a dropping funnel, and the flask was purged with nitrogen gas for 30 minutes. After that, the contents were heated to a temperature of 80° C. while stirring with a magnetic stirrer.

Subsequently, the monomer solution was added to the flask over three hours by using a dropping funnel. Upon the completion of the dropwise addition, the mixture was aged for 3 hours and cooled to a temperature of lower than 30° C. to obtain a polymer solution.

The polymer solution was then transferred to a 2 liter separatory funnel and homogeneously diluted with 150 g of n-hexane followed by addition and mixing of 600 g of methanol. Subsequently, 30 g of distilled water was further added, stirred and kept for 30 minutes. After that, the bottom layer was collected and prepared as a propylene glycol monomethyl ether acetate solution. The polymer contained in this propylene glycol monomethyl ether acetate solution was indicated as "polymer (A-1)".

The polymer (A-1) was found to be a copolymer having Mw of 6,500, Mw/Mn of 1.7 and content ratio of the repeating units originating from each monomer of 26.6:58.2:15.2 (% by mol) [(M-3):(M-1):(M-4)] as determined by $^{13}$C-NMR analysis.

<Synthesis of Polymers (A-2) to (A-14)>

Polymers (A-2) to (A-14) were synthesized in the same manner as those for the polymer (A-1) except that the compound (monomer) was used with the type and charging amount shown in Table 1. In addition, each polymer of the weight average molecular weight (Mw) and the dispersity (Mw/Mn) was calculated.

In Table 2, the molecular weight (Mw) and the dispersity (Mw/Mn) of the polymers (A-1) to (A-14) are described.

TABLE 1

|  | Polymer | Monomer 1 | Charging amount (mol %) | Monomer 2 | Charging amount (mol %) | Monomer 3 | Charging amount (mol %) |
|---|---|---|---|---|---|---|---|
| Polymerization Example 1 | A-1 | M-3 | 25 | M-1 | 60 | M-4 | 15 |
| Polymerization Example 2 | A-2 | M-3 | 35 | M-1 | 60 | M-4 | 5 |
| Polymerization Example 3 | A-3 | M-3 | 25 | M-2 | 60 | M-4 | 15 |
| Polymerization Example 4 | A-4 | M-3 | 25 | M-1 | 60 | M-5 | 15 |
| Polymerization Example 5 | A-5 | M-3 | 25 | M-1 | 60 | M-6 | 15 |
| Polymerization Example 6 | A-6 | M-3 | 25 | M-1 | 60 | M-7 | 15 |
| Polymerization Example 7 | A-7 | M-3 | 25 | M-1 | 60 | M-8 | 15 |
| Polymerization Example 8 | A-8 | M-3 | 25 | M-1 | 60 | M-9 | 15 |
| Polymerization Example 9 | A-9 | M-3 | 25 | M-1 | 60 | M-10 | 15 |
| Polymerization Example 10 | A-10 | M-3 | 25 | M-1 | 60 | M-11 | 15 |
| Polymerization Example 11 | A-11 | M-3 | 35 | M-1 | 65 |  | — |
| Polymerization Example 12 | A-12 | M-3 | 70 | M-4 | 30 |  | — |
| Polymerization Example 13 | A-13 | M-3 | 50 | M-7 | 50 |  | — |
| Polymerization Example 14 | A-14 | M-13 | 80 | M-12 | 20 |  | — |

TABLE 2

|  | Polymer | Monomer 1 (mol %) | Monomer 2 (mol %) | Monomer 3 (mol %) | Mw | Mw/Mn |
|---|---|---|---|---|---|---|
| Polymerization Example 1 | A-1 | 26.6 | 58.2 | 15.2 | 6500 | 1.7 |
| Polymerization Example 2 | A-2 | 35.2 | 60.0 | 4.8 | 6700 | 1.6 |
| Polymerization Example 3 | A-3 | 24.4 | 60.5 | 15.1 | 6100 | 1.6 |
| Polymerization Example 4 | A-4 | 27.5 | 58.3 | 14.2 | 6200 | 1.6 |
| Polymerization Example 5 | A-5 | 24.7 | 61.2 | 14.1 | 6500 | 1.7 |
| Polymerization Example 6 | A-6 | 24.4 | 60.8 | 14.8 | 7000 | 1.5 |
| Polymerization Example 7 | A-7 | 24.0 | 60.5 | 15.5 | 6900 | 1.6 |
| Polymerization Example 8 | A-8 | 23.8 | 61.1 | 15.1 | 7500 | 1.5 |
| Polymerization Example 9 | A-9 | 22.5 | 62 | 15.5 | 7400 | 1.5 |
| Polymerization Example 10 | A-10 | 27.4 | 57.4 | 15.2 | 6100 | 1.6 |
| Polymerization Example 11 | A-11 | 40.9 | 59.1 | — | 6300 | 1.7 |
| Polymerization Example 12 | A-12 | 70.8 | 29.2 | — | 6900 | 1.7 |
| Polymerization Example 13 | A-13 | 71.9 | 28.1 | — | 6600 | 1.6 |
| Polymerization Example 14 | A-14 | 80.9 | 19.1 | — | 9800 | 2.2 |

<Synthesis of Polymer (B-1) as Polymer (B)>

A monomer solution was prepared by dissolving monomers consisting of 34.68 g (40% by mol) of the following compound (M-A), 12.80 g (10% by mol) of the following compound (M-B), 45.81 g (40% by mol) of the following compound (M-C), and 6.71 g (10% by mol) of the following compound (M-D) in 200 g of 2-butanone, and further charging 4.23 g of 2,2'-azobis isobutyronitrile.

On the other hand, a three-necked flask having 100 g of 2-butanone charged was purged with nitrogen gas for 30 minutes. After the purge, the reaction vessel was heated to a temperature of 80° C. while stirring and the previously prepared monomer solution was added dropwise using a dropping funnel over three hours. The initiation of the addition was set to a polymerization starting time and polymerization reaction was carried out for six hours. After the polymerization, the polymer solution was cooled with water to a temperature of 30° C. or lower and 4,000 g of methanol was charged. A white precipitate produced was collected by filtration. The white powder collected by filtration was washed twice with 800 g of methanol in a slurry state, filtered again, and dried at a temperature of 50° C. for 17 hours to obtain a polymer in the form of white powder (70 g, yield 70%).

The polymer (B-1) was found to be a copolymer having Mw of 5800, Mw/Mn of 1.5 and content ratio of the repeating units originating from each monomer of 39.2:9.2:41.5:10.1 (mol %) [(M-A):(M-B):(M-C):(M-D)] as determined by $^{13}$C-NMR analysis.

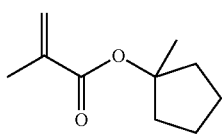

(M-A)

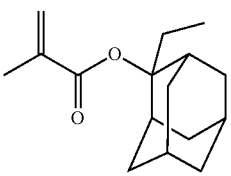

(M-B)

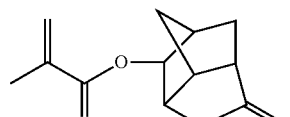

(M-C)

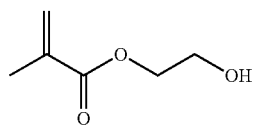

(M-D)

2. Preparation of Radiation Sensitive Resin Composition

With the blending ratio shown in Table 3, the polymer (A), polymer (B), acid generator (C), nitrogen containing compound (D), and solvent (E) were admixed with another to prepare radiation sensitive resin composition for Examples 1 to 13 and Comparative Example 1. Components other than the polymers (A) and (B) that are described in Table 3 are as follows, and "part" in the tables is based on weight.

<Acid Generator>

(C-1): The Compound Represented Below.

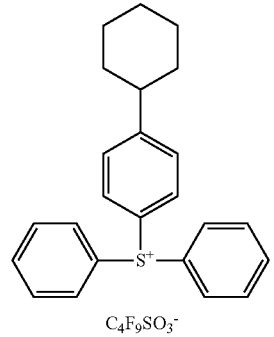

<Nitrogen Containing Compound (D)>

(D-1): N-t-Butoxycarbonyl-4-hydroxypiperidine

<Solvent (E)>

(E-1): Propylene Glycol Monomethyl Ether Acetate (E-2): Cyclohexanone

TABLE 3

| | Polymer (B) (parts) | Polymer (A) (parts) | Acid generator (C) (parts) | Nitrogen containing compound (D) (parts) | Solvent (E) (parts) |
|---|---|---|---|---|---|
| Example 1 | B-1 (100) | A-1 (3) | C-1 (12) | D-1 (1) | E-1 (1400) E-2 (600) |
| Example 2 | B-1 (100) | A-2 (3) | C-1 (12) | D-1 (1) | E-1 (1400) E-2 (600) |
| Example 3 | B-1 (100) | A-3 (3) | C-1 (12) | D-1 (1) | E-1 (1400) E-2 (600) |
| Example 4 | B-1 (100) | A-4 (3) | C-1 (12) | D-1 (1) | E-1 (1400) E-2 (600) |
| Example 5 | B-1 (100) | A-5 (3) | C-1 (12) | D-1 (1) | E-1 (1400) E-2 (600) |
| Example 6 | B-1 (100) | A-6 (3) | C-1 (12) | D-1 (1) | E-1 (1400) E-2 (600) |
| Example 7 | B-1 (100) | A-7 (3) | C-1 (12) | D-1 (1) | E-1 (1400) E-2 (600) |
| Example 8 | B-1 (100) | A-8 (3) | C-1 (12) | D-1 (1) | E-1 (1400) E-2 (600) |
| Example 9 | B-1 (100) | A-9 (3) | C-1 (12) | D-1 (1) | E-1 (1400) E-2 (600) |
| Example 10 | B-1 (100) | A-10 (3) | C-1 (12) | D-1 (1) | E-1 (1400) E-2 (600) |
| Example 11 | B-1 (100) | A-11 (3) | C-1 (12) | D-1 (1) | E-1 (1400) E-2 (600) |
| Example 12 | B-1 (100) | A-12 (3) | C-1 (12) | D-1 (1) | E-1 (1400) E-2 (600) |
| Example 13 | B-1 (100) | A-13 (3) | C-1 (12) | D-1 (1) | E-1 (1400) E-2 (600) |
| Comparative Example 1 | B-1 (100) | A-14 (3) | C-1 (12) | D-1 (1) | E-1 (1400) E-2 (600) |

[3] Evaluation of Radiation Sensitive Resin Composition

The radiation sensitive resin compositions of Examples 1 to 13 and Comparative Example 1 were subjected to the following evaluation (1) to (3). The evaluation results are shown in Table 4.

Evaluation methods are as follows.

(1) Measurement of Receding Contact Angle

The radiation sensitive resin composition was spin-coated on a substrate by using "CLEAN TRACK ACT 8", and prebaked (PB) on a hot plate at a temperature of 100° C. for 60 seconds to form a film (photoresist film) having a thickness of 100 nm. The receding contact angle was immediately measured by the following method at a temperature of 23° C. (room temperature) and a humidity of 45% under atmospheric pressure using a contact angle meter "DSA-10" (manufactured by KRUS).

Specifically, the position of the wafer stage of the contact angle meter was adjusted, and the substrate was placed on the stage. After injecting water into a needle, the position of the needle was finely adjusted to the initial position at which a waterdrop could be formed on the substrate. Water was then discharged from the needle to form a waterdrop (25 µl) on the substrate. After removing the needle, the needle was moved downward to the initial position, and introduced into the waterdrop. The waterdrop was sucked via the needle for 90 seconds at a rate of 10 µl/min, and the contact angle between the liquid surface and the substrate was measured every second (90 times in total). The average value of twenty contact angle measured values (20 seconds) after the measured value became stable was calculated, and taken as the receding contact angle) (°).

(2) Change in Contact Angle of Developer Before and after PEB

A substrate coated with the resin composition was prepared in the same manner as those in (1) above and contact angle of a developer was measured in the following order.

In addition, a substrate coated with the resin composition was prepared in the same manner as (1) and the film was exposed to radiation through a 6% HT mask under conditions of NA=0.75, σ=0.85, and ½ annular using an ArF excimer laser liquid immersion exposure apparatus "NSR S306C" manufactured by Nikon Corp. After the exposure, it was subjected to post exposure bake (PEB) at a temperature of 95° C. for 60 seconds. The contact angle of a developer was measured in the following order immediately.

According to the method described above, a difference in contact angle of the developer before and after PEB (Δ ((contact angle before PEB)−(contact angle after PEB))) was calculated, and evaluated based on the following criteria.

A: (Δ ((contact angle before PEB)−(contact angle after PEB))) is the same or greater than 10°.

B: (Δ ((contact angle before PEB)−(contact angle after PEB))) is the same or greater than 5° but less than 10°.

C: (Δ ((contact angle before PEB)−(contact angle after PEB))) is less than 5°.

<Measurement of Receding Contact Angle>

The contact angle was measured in the following order at a temperature of 23° C. (room temperature) and a humidity of 45% under atmospheric pressure using "DSA-10" (manufactured by KRUS).

Specifically, the position of the wafer stage of the contact angle meter was adjusted, and the substrate was placed on the stage. After injecting a developer into a needle, the position of the needle was finely adjusted to the initial position at which a droplet could be formed on the substrate. The developer was then discharged from the needle to form a droplet (25 µl) on the substrate. The contact angle between the liquid surface and the substrate was measured.

(3) Defects

Onto a 12-inch silicon wafer on which an underlayer antireflection film "ARC 66" manufactured by Nissan Chemical Ind., Ltd. was formed, a coating film having a thickness of 100 nm was formed with the radiation sensitive resin composition. Next, the film was exposed to radiation through a mask pattern which has a line and space pattern (1L/1S) with a width of 55 nm as a target size under conditions of NA=0.78, and crosspole using an ArF excimer laser liquid immersion exposure apparatus "NSR S610C" manufactured by Nikon Corp. After the exposure, it was subjected to post exposure bake (PEB) at a temperature of 95° C. for 60 seconds. The resist film was then developed at a temperature of 23° C. for 30 seconds in a tetramethylammonium hydroxide aqueous solution at a concentration of 2.38% by weight, washed with water, and dried to form a positive type resist pattern. An exposure dose at which a 1:1 line•and•space (1L1S) pattern with a line width of 55 nm was formed was taken as an optimum exposure dose. Specifically, the line and space with a line width of 55 nm was formed on the entire surface of the wafer according to checkered pattern shot, yielding a wafer for evaluating defects. A scanning electron microscope "S-9380" manufactured by Hitachi High-Technologies Corporation was used for the measurement.

Subsequently, the number of defects on the wafer for evaluating defects was measured using "KLA2351" manufactured by KLA-Tencor Corp. The defects measured were classified into those appeared to be originating from resist and those appeared to be originating from foreign matters. As a result of the classification, when the total number of defects appeared to be originating from resist is 100 or more/wafer, it was determined as "bad." When it is less than 100/wafer, it was determined as "good."

(4) Difference Between Advancing Contact Angle and Receding Contact Angle (Δ ((Advancing Contact Angle)–(Receding Contact Angle)))

Using the measurement results of the receding contact angle from (1) above and the following advancing contact angle, a difference between the advancing contact angle and the receding contact angle (Δ ((advancing contact angle)–(receding contact angle))) was calculated, and evaluated based on the following criteria.

A: absolute value of (Δ ((advancing contact angle)–(receding contact angle))) was less than 20°.

B: absolute value of (Δ ((advancing contact angle)–(receding contact angle))) was the same or greater than 20°.

<Measurement of Advancing Contact Angle>

A substrate (wafer) wherein a coating film was formed with the radiation sensitive resin composition using "DSA-10" manufactured by KRUS was fabricated. Promptly after the fabrication, the advancing contact angle was measured at room temperature (23° C.) and humidity of 45% under atmospheric pressure according to the following procedure.

(1) The position of the wafer stage of the contact angle meter was adjusted.
(2) The substrate was placed on the stage.
(3) Water was injected into a needle.
(4) The position of the needle was finely adjusted.
(5) Water was then discharged from the needle to form a waterdrop (25 μl) on the wafer.
(6) The needle was once removed.
(7) The needle was moved downward to the position adjusted in (4) above again.
(8) The waterdrop was sucked via the needle for 90 seconds at a rate of 10 μl/min, and the contact angle was measured every second (90 times in total).
(9) The average value of twenty contact angle measured values after the measured value became stable was calculated, and taken as the advancing contact angle.

TABLE 4

| | Receding contact angle | Contact angle of developer | Difference between advancing contact angle and receding contact angle | Defects |
|---|---|---|---|---|
| Example 1 | 75° or more | A | A | Good |
| Example 2 | 75° or more | A | A | Good |
| Example 3 | 75° or more | A | A | Good |
| Example 4 | 75° or more | A | A | Good |
| Example 5 | 75° or more | A | A | Good |
| Example 6 | 75° or more | A | A | Good |
| Example 7 | 75° or more | A | A | Good |
| Example 8 | 75° or more | A | A | Good |
| Example 9 | 75° or more | A | A | Good |
| Example 10 | 75° or more | A | A | Good |
| Example 11 | 75° or more | B | A | Good |
| Example 12 | 75° or more | A | B | Good |
| Example 13 | 75° or more | A | B | Good |
| Comparative Example 1 | 75° or more | C | A | Bad |

As clearly from the results in Table 4, when the radiation sensitive resin composition of Examples 1 to 13 were used, high receding contact angle of the liquid for liquid immersion exposure was obtained and development defects were hardly generated. For such reasons, it is believed that the radiation sensitive resin composition of the present invention can be suitably used for minute lithographic process that will be required in the future.

The invention claimed is:

1. A radiation sensitive resin composition comprising,
a first polymer (A) which comprises:
   a repeating unit (1) represented by the following general formula (1); and
   a repeating unit (2) being other than the repeating unit (1), having an acid labile group, and being represented by the following general formula (2-1), a total amount of the repeating unit (1) and the repeating unit (2) is at least about 85 mol % based on a total amount of repeating units included in the first polymer;
a second polymer (B) which comprises an acid labile group and is dissociated by an action of acid so that alkali solubility is given by dissociation of said acid labile group; and
a radiation sensitive acid generator (C),

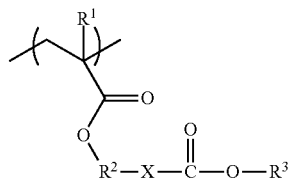

(1)

wherein, in the formula, $R^1$ represents a hydrogen atom, a methyl group, or a trifluoromethyl group, $R^2$ represents a single bond, a divalent linear, branched, or cyclic, and saturated or unsaturated hydrocarbon group having 1 to 20 carbon atoms, X represents a methylene group substituted with a fluorine atom, or a linear or branched fluoroalkylene group having 2 to 20 carbon atoms, and $R^3$ represents a monovalent organic group,

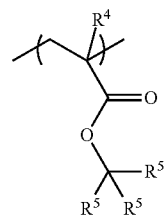

(2-1)

wherein, in the formula, $R^4$ represents a hydrogen atom, a methyl group, a trifluoromethyl group, or a hydroxymethyl group, and $R^5$ each independently represents a linear or branched alkyl group having 1 to 4 carbon atoms, a monovalent alicyclic hydrocarbon group having 4 to 20 carbon atoms, or a group derived therefrom, or any two of $R^5$ bind to each other and form, together with the carbon atom to which they are attached, a divalent alicyclic hydrocarbon group having 4 to 20 carbon atoms, or a group derived therefrom, and the remaining one $R^5$ represents a linear or branched alkyl group having 1 to 4 carbon atoms, a monovalent alicyclic hydrocarbon group having 4 to 20 carbon atoms, or a group derived therefrom.

2. The radiation sensitive resin composition according to claim 1, wherein the polymer (A) comprises, as said repeating unit (2), a repeating unit represented by the following general formula (2-1-1),

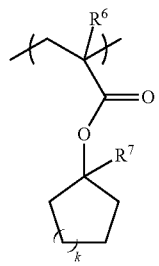
(2-1-1)

wherein, in the formula, $R^6$ represents a hydrogen atom, a methyl group, a trifluoromethyl group, or a hydroxymethyl group, $R^7$ represents a linear or branched alkyl group having 1 to 4 carbon atoms, and k represents an integer of 1 to 4.

3. The radiation sensitive resin composition according to claim 1, wherein said polymer (A) further comprises a repeating unit (3) having an alkali soluble group and being other than said repeating unit (1), or a repeating unit (4) having an alkali reactive group and being other than said repeating unit (1).

4. The radiation sensitive resin composition according to claim 3, wherein said repeating unit (3) comprises, as said alkali soluble group, a functional group having a hydrogen atom having a pKa of 4 to 11.

5. The radiation sensitive resin composition according to claim 3, wherein said repeating unit (3) comprises, as said alkali soluble group, at least one of functional groups represented by the following formulae (3a) to (3c),

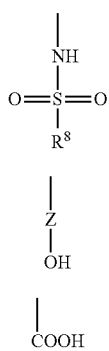
(3a)

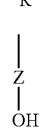
(3b)

(3c)

wherein, in the formulae, $R^8$ represents a hydrocarbon group having 1 to 10 carbon atoms substituted with a fluorine atom, and Z represents a fluoromethylene group or an alkylene group having 2 to 20 carbon atoms substituted with a fluorine atom.

6. The radiation sensitive resin composition according to claim 3, wherein said repeating unit (4) comprises, as said alkali reactive group, a functional group having lactone skeleton or cyclic carbonate structure.

7. The radiation sensitive resin composition according to claim 3, wherein said polymer (A) comprises, as said repeating unit (4), at least one of repeating units represented by the following general formulae (4a-1) to (4a-6) and a repeating unit represented by the following general formula (4b),

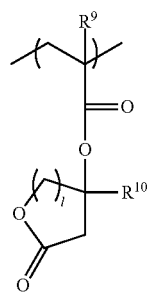
(4a-1)

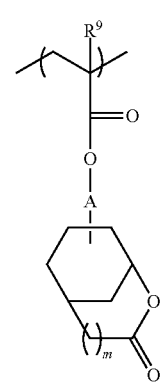
(4a-2)

(4a-3)

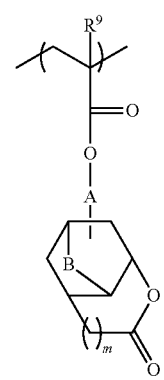

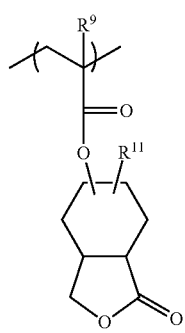
(4a-4)

(4a-5)

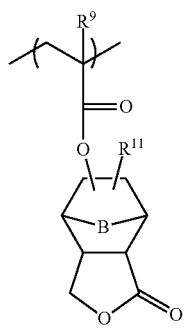

(4a-6)

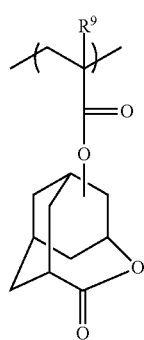

wherein, in the formulae, $R^9$ represents a hydrogen atom or a methyl group, $R^{10}$ represents a hydrogen atom or an alkyl group having 1 to 4 carbon atoms which may have a substituent group, $R^{11}$ represents a hydrogen atom or a methoxy group, A represents a single bond, an ether group, an ester group, a carbonyl group, a divalent chained hydrocarbon group having 1 to 30 carbon atoms, a divalent alicyclic hydrocarbon group having 3 to 30 carbon atoms, a divalent aromatic hydrocarbon group having 6 to 30 carbon atoms, or a divalent group obtained by combination thereof, B represents an oxygen atom or a methylene group, l represents an integer of 1 to 3, and m represents 0 or 1, (4b)

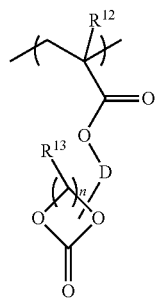

wherein, in the formula, $R^{12}$ represents a hydrogen atom, a methyl group, or a trifluoromethyl group, $R^{13}$ represents a hydrogen atom or a chain hydrocarbon group having 1 to 5 carbon atoms, and when a plurality of $R^{13}$ is present, each may be the same or different from each other, D represents a single bond, a divalent or trivalent chained hydrocarbon group having 1 to 30 carbon atoms, a divalent or trivalent alicyclic hydrocarbon group having 3 to 30 carbon atoms, or a divalent or trivalent aromatic hydrocarbon group having 6 to 30 carbon atoms, and when D is trivalent, the carbon atom included in D and the carbon atom constituting the cyclic carbonate ester bind to each other to form a ring structure, and n represents an integer of 2 to 4.

8. The radiation sensitive resin composition according to claim 1, wherein the content of said polymer (A) is in the range from 0.1 to 20 parts by mass based on 100 parts by mass of said polymer (B).

9. A method for forming a resist pattern, comprising:
(1) forming a photoresist film on a substrate by using said radiation sensitive resin composition according to claim 1,
(2) subjecting said photoresist film to a liquid immersion exposure process via a liquid immersion medium after setting said liquid immersion medium on said photoresist film,
(3) developing the photoresist film obtained after said liquid immersion exposure process to form a resist pattern.

* * * * *